United States Patent
Ignjatovic et al.

(10) Patent No.: US 6,313,778 B1
(45) Date of Patent: Nov. 6, 2001

(54) METHOD AND A SYSTEM OF ACQUIRING LOCAL SIGNAL BEHAVIOR PARAMETERS FOR REPRESENTING AND PROCESSING A SIGNAL

(76) Inventors: Aleksandar Ignjatovic, 2101 California St., #229, Mountain View, CA (US) 94040; Nicholas A. Carlin, 123 Yukon, San Francisco, CA (US) 94114

( * ) Notice: Subject to any disclaimer, the term of this patent is extended or adjusted under 35 U.S.C. 154(b) by 0 days.

(21) Appl. No.: 09/614,886

(22) Filed: Jul. 9, 2000

Related U.S. Application Data
(60) Provisional application No. 60/143,074, filed on Jul. 9, 1999.

(51) Int. Cl.[7] ............................................. H03M 1/12
(52) U.S. Cl. ................................................. 341/155
(58) Field of Search ........................... 341/155; 375/316; 455/131, 313; 708/300

(56) References Cited

U.S. PATENT DOCUMENTS

| | | | |
|---|---|---|---|
| 5,668,836 | * 9/1997 | Smith et al. | 375/316 |
| 6,115,726 | 9/2000 | Ignjatovic | 708/300 |

FOREIGN PATENT DOCUMENTS

WO/99 18666  4/1999 (WO).

* cited by examiner

*Primary Examiner*—Brian Young
(74) *Attorney, Agent, or Firm*—Skjerven Morrill MacPherson LLP

(57) ABSTRACT

A method and a system for acquiring signal behavior parameters (LSBPs) of a band-limited (BL) signa, for representing and processing the signal, wherein the LSBPs encode the signal's local behavior in between Nyquist rate points. Preferably, a section of a BL signal within a sampling window is represented as a truncated series of order n at a sampling moment within the sampling window. The truncated series having n+1 LSBPs as its coefficients, encoding the signal's local behavior between Nyquist rate points. Compared to the conventional approach that encodes a signal's behavior by signal samples taken at Nyquist rate points, the invention encodes more signal behavior. Discrete signal samples are obtained from the signal. The LSBPs are solved numerically such that the interpolated values of the truncated series provide the least-square fit with the discrete signal samples. The LSBPs are repectively the values of chromatic differential operators of order 0 to order n evaluated at the sampling moment.

150 Claims, 8 Drawing Sheets

METHOD AND A SYSTEM OF ACQUIRING LOCAL SIGNAL BEHAVIOR PARAMETERS FOR REPRESENTING AND PROCESSING A SIGNAL

This application claims the benefit under 35 U.S.C. section 119(e) of U.S. Provisional application Ser. No. 60/143,074, filed on Jul. 9, 1999, entitled "Signal Processing with Local Signal Behavior", naming Aleksandar Ignjatovic and Nicholas A. Carlin as inventors, which provisional application discloses an exemplary embodiment of the present invention and which is incorporated herein by reference in its entirety.

FIElD OF THE INVENTION

The invention relates to signal representation and processing, particularly to signal representation and processing using local signal behavior parameters.

BACKGROUND

The standard method of signal processing uses representation of band-limited signals by Nyquist rate samples. Unique deterMination of band limited signals requires a sequence of Nyquist rate samples from the entire interval (−∞,∞). Moreover, such a sequence contains no redundant information, because by Nyquist's Theorem for arbitrary sequence of real numbers $\{a_m\}_{m=Z}$ such that $$\sum_{m=-\infty}^{\infty} a_m^2 < \infty$$

there exists a π band-limited signal f(t) such that $f(m)=a_m$. Of course, in practice operators act (essentially) on a sequence of approximations of the input signal obtained using a suitable moving window and setting the values of the signal to 0 at all sampling points outside of the support of the window.

Historically, numerical signal processing is older than the use of digital computers. For example, fast Fourier transforms (FFT) were first performed by hand. Also, early hardware for data acquisition (A/D conversion) and for numerical data processing was very limited in speed and capacity. In such circumstances it was important that the signal be represented without any redundancy and that the implementations of signal processing operators required minimal number of basic arithmetical operations. This detrined the direction of the development of signal processing algorithms, which resulted in an extremely elaborate and powerful signal processing paradigm centered around the "minimalist" representation of signals by the Nyquist rate samples. This paradigm is usually referred to as "signal processing based on harmonic analysis."

However, such "minimast" approach to signal representation, free of any redundancy, need not always be optimal. Specifically, the standard signal processing operators act on sequences of values of the input signal at consecutive (Nyquist rate spaced) sampling points which are within the support of an appropriate window. These values are stored in some form of a shift register and the output value is then obtaned either from these samples alone (FIR procedures) or from these samples together with the previously computed value of the signal (IIR procedures). Both types of procedures necessarily produce significant delays and/or phase-shifts in the output signal.

Moreover, although the present-day hardware is capable of accessing the information contained between the Nyquist rate sampling points, no approach based on harmonic analysis has been able to encode this information without producing troublesome proliferation of numerical data which must be stored. The concept of "Signal Processor With Local Signal Behavior" had introduced a method for using the information contained between the Nyquist rate sampling pointswithout producing troublesome proliferation of numerical data which must be stored, and without significantly increasing the computational complexity of the algorithms for subsequent processing of the data.

A need exists for signal representation and processing that does not necessarily produce delays and/or phase-shifts in the output signal. Also, a need exists for signal representation and processing that is not limited by the standard approaches. In particular, a need exists for making use of the information contained between Nyquist rate points without producing troublesome proliferation of numerical data which must be stored. Moreover, given the present-day hardware, a need exists to access this information without increasmg the computational complexity of the algorithms. The present invention provides methods for the above tasks significantly improving on those decribed in the invention "Signal Processor With Local Signal Behavior".

SUMMARY

The invention provides signal rpresentation and processing that does not necessarily produce delays and/or phase-shifts shifts in the output signal, much superior to the one described in the invention "Signal Processor With Local Signal Behavior". Also, the invention provides superior signal representation and processing that go beyond the standard approaches of harmonic analysis. In particular, the invention makes use of the information contained between Nyquist rate points and represents it in an extremely efficient way. Moreover, given the present-day hardware, the invention provides means for signal processing with low computational complexity of the algorithms.

Specifically, the invention is drawn to a method and a system for facilitated acquisition of local signal behavior parameters (LSBPs) of a band-limited (BL) signal, wherein the LSBPs encode the signal's local behavior in between Nyquist rate points. Present-day hardware is capable of accessing the information contained between the Nyquist rate sampling points. This information can be encoded by LSBPs in a way which neither produces troublesome proliferation of numerical data which must be stored, nor does it increase the computational complexity of the algorithms for subsequent data processing.

More specifically, the values of the signal between the Nyquist rate points can be accessed using an array (or a matrix) of suitable analog, digital, or mixed signal pre-processing stages. This access can be done in a discrete format (i.e., as discrete voltages as in CCD type devices, numerical digital values provided by an oversampling A/D convertor. This access can also be done in a continuous format (by various analog multipliers-inegrators). or an analog or mixed signal multiplier-integrator circuit as described in this invention). The values of these LSBPs can be obtained from the pre-processing devices at Nyquist rate or even sub-Nyquist rate. These LSBPs are obtained in parallel by some suitable hardware. The LSBPs describe the local signal behavior around a Nyquist rate sampling point. Additionally, the LSBPs encode local signal behavior of the signal between Nyquist rate points.

Preferably, a section of a BL signal within a sampling window is represented as a truncated series of order n at a sampling moment within the sampling window. The truncated series having n+1 LSBPs as its coefficients, encoding the signal's local behavior between Nyquist rate points. Compared to the conventional approach that encodes a signal's behavior by signal samples taken at Nyquist rate points, the invention encodes more accurately and more completely the behavior of the input signal. The LSBPs are solved numerically such that the interpolated values of the truncated series provide the best fit with the input signal. The LSBPs are repcctively the values of chromatic differential operators of order 0 to order n evaluated at the sampling moment. As understood herein, the present embodiment is not limited to the least-square fitting technique. In an alternative embodiment, curve fitting techniques other than least-square fit technique can also be implemented. Also as understood herein, LSBPs need not be solved by using discrete signal samples. For example, in another embodiment, LSBPs are solved by using a continuous signal section.

Alternatively, when a sampling window is constituted by two local sampling windows sharing an overlap, a section of a BL analog signal has a first subsection in the first local window and a second subsection in the second local window. In this scenario, the first subsection is first represented as a first truncated series at a first sampling moment in the first local window. This first truncated series is parametrized by n+1 coefficients that are n+1 LSBPs adapted for chacterizing local signal behavior of the first subsection between Nyqust points. The second subsection is represented as a second truncated series at a second sampling moment in the second local window. This second truncated series is parametrized by m+1 coefficients that are m+1 LSBPs adapted for characterizing local signal behavior of the second subsection between Nyquist points. Numerical values of the n+1 and m+1 LSBPs are used together to produce k numerical values of the LSBPs for some k>n and k>m. These k LSBPs provide a single curve fitting over both local sampling windows. As understood herein, the present embodiment is not restricted to the least-square fitting technique. In an alternative embodiment, curve fitting techniques other than least-square fit technique are implemented. Also as understood herein, LSBPs need not be solved by using discrete signal samples. For example, in another embodiment, LSBPs are solved by using a continuous signal section.

In another embodiment, the invention is drawn to an over-sampling analog/digital (A/D) converter followed by an array of multiplier-accumulator circuits which comprises in this case a data acquisition unit. The data aquisition unit is adapted for obtaining LSBPs to characterize an input signal. In particular, the data acquisition performs the steps that include representing the input signal as a truncated series (at a time t) having the LSBPs as coefficients, obtaining discrete signal samples or a continuous signal section from the input signal, and solving for the LSBPs by an approximation technique such as, for example, least-square fitting. Typically, the truncated series is formed by fundamental basis functions. Moreover, the LSBPs are values of chromatic linear operators of various orders evaluated at the time t.

In another embodiment, the invention is drawn to a analog or mixed signal multiplier-integrator circuit that includes a data acquisition unit for obtaining LSBPs to characterize an input signal. In particular, the data acquisition performs the steps that include representing the input signal as a truncated series (at a time t) having the LSBPs as coefficients, obtaining discrete signal samples or a continuous signal section from the input signal, and solving for the LSBPs by an approximation technique such as, for example, least-square fitting. Typically, the truncated series is formed by fundamental basis functions. Moreover, the LSBPs are values of chromatic linear operators of various orders evaluated at the time t. In particular, this circuit can be obtained by combining a multiplying digital to analog converter followed by an analog integrator. More specifically, the input signal is used as a variable reference voltage of the multiplying D/A converter, whose digital input is supplied by a properly clocked digital values of a fixed function. These digital values can be stored in a memory for which thery are sent to the above mentioned D/A converter timed with a clock whose speed corresponds to an over-sampling frequency with respect to the input signal. The output of this D/A converter is then fed to the analog integrator circuit whose output is sampled at the end of each intergation period. The length of this integration period depends on the number of LSBPs being acquired. After sampling, the integrator is reset, and the cycle is repeated.

In yet another embodiment, the invention is drawn to a signal processing system for processing LSBPs obtained by the steps that include representing the input signal as a truncated series having the LSBPs as coefficients, obtaining discrete signal samples or a continuous signal section from the input signal, and solving for the LSBPs by an approximation technique such as, for example, least-square fitting. Typically, the truncated series is formed by fundamental basis functions. Moreover, the LSBPs are values of chromatic linear operators of various orders evaluated at the time t.

The present invention significantly improves the mentioned one, by: increasing accuracy, reducing the requirements for data storage, and by allowing simpler algorithms for signal processing.

DETAILED DESCRIPTION

Figure 1A:
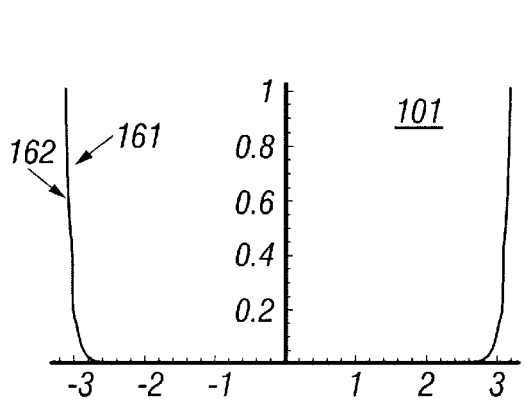
FIGS. 1A–1C are graphs plotted at three different resolutions for comparing two multiplicative factors associated with an ordinary derivative differential operator.
Figure 1D:
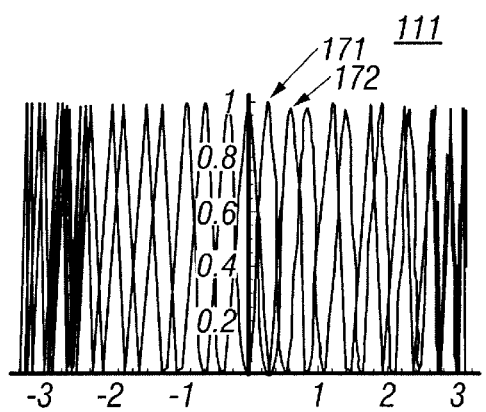
FIGS. 1D–1F are graphs plotted at three different resolutions for comparing two multiplicative factors associated with chromatic differential operator.
Figure 1B:
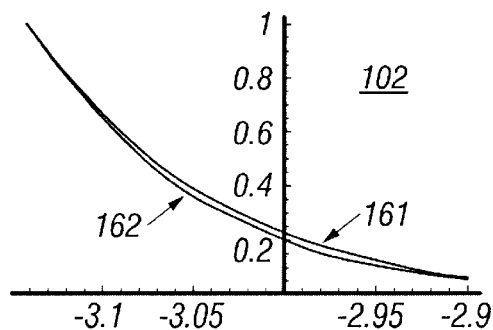
Figure 1E:
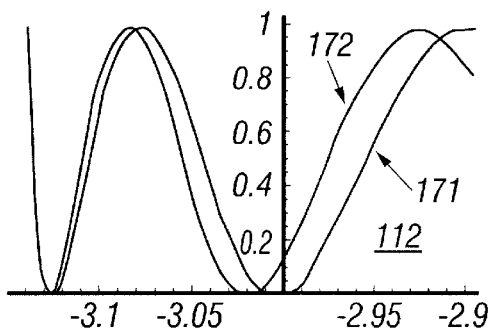
Figure 1C:
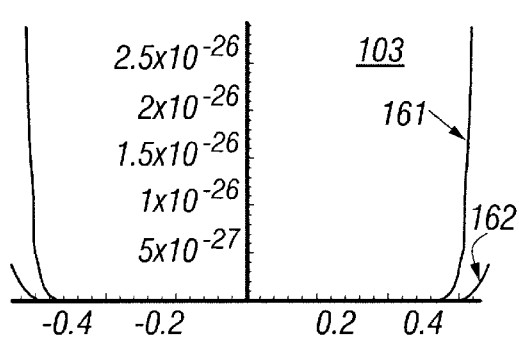
Figure 1F:
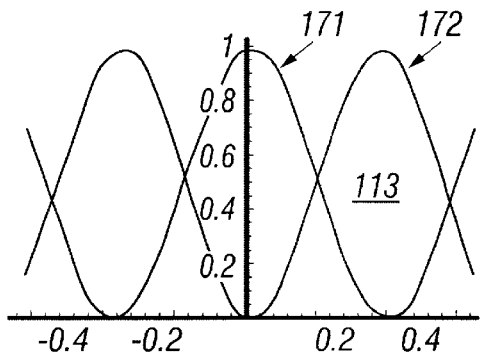

The Chromatic Signal Processsmg method (CSP) is based on differential operators of a special kind. It allows signal processing based on local signal behavior, i.e. behaviour of the signal over a relatively short period of time, provided that the signal is given either by its sufficiently ovesampled values (with repect to its corresponding Nyquist rate) or by its analog format. If the signal is given by Nyquist rate samples, the method is still applicable, but some of its features are lost CSP not only naturaly integrates with methods based on harmonic analysis but also it greatly enhances these methods adding complementary means based on a different mathematical paradigm (genuine differential calculus, rather than finite differences).

Here the fundamental procedures systems of CSP are disclosed together with the underlying basic mathematical principles.

Signal Representation

The method of harmonic analysis represents the signal by the Nyquist interpolation formula, $$f[t] = \sum_{k=-\infty}^{\infty} f[k] \frac{\sin[\pi(t-k)]}{\pi(t-k)},$$

which is a linear combination of all integer shifts $$\frac{\sin[\pi(t-k)]}{\pi(t-k)}$$

of a single faction $$\frac{\sin[\pi t]}{\pi t},$$

with coefficients equal to the values f[k] of the input signal f at these integers. The method of wavelets, on the other hand, represents the input signal as a linear combination of integer shifts and binary scalings $\psi[2^j t - k]$ of a single "mother wavelet" $\psi[t]$.

CSP method uses representation of the signal obtained using a single operator CD[.,.] such that for each k, CD[k, .] is a linear differential operator of order k. The signal is represented in the form of a sum of the outputs of the operator CD[k, .] applied to a single basis function $B_0[t]$, with coefficients obtained by applying the same differential operator CD[k, .] on the input signal and then evaluating these outputs at the central point of expansion $t_0$. This results in a "Taylor-type" expansion whose convergence properties make such representation highly local, with error of approximation minimal around the central point of expansion $t_0$. Such expansion has the following form:

$$f[t] = \sum_{k=0}^{\infty} A_k CD[k, f][t_0] CD[k, B_0[t - t_0]],$$

with functions CD[k, $B_0[t-t_0]$] replacing polynomials $$\frac{(t-t_0)^k}{k!},$$

and with coefficients CD[k, f] [$t_0$] replacing the values $f^{(k)}(t_0)$ of the standard operator of differentiation in the standard Taylor's formula. However, the error of approximation at a point t moving away from the central point of expansion $t_0$ has different features than the error of the standard Taylor's expansion. These coefficients CD[k,f][$t_0$] can be considered as local signal behavior parameters (LSBPs) that encode the local behavior of f[t] between Nyquist rate points. Moreover, differential operators CD[n, f] have the property that, unlike the standard differentiation operators, they faithfully encode the spectral content of the signal without accumulating the noise. For this reason the family of linear differential operators $\{CD[n, f]\}_{n \in N}$ obtained from the operator CD[.,.] defined by recursion are called a family of Chromatic Derivative. Chromatic derivatives of high order (16 and above) can be evaluated with accuracy better than $10^{-3}$ of their full scale, in the presence of out-of-band noise exceeding in amplitude the signal itself. Functions CD [k, $B_0[t-t_0]$ ] replace polynomials used in the invention "Signal Processor With Local Signal Behavior" and represent a significant improvement, providing much higher accuracy, as well as simplified and novel signal processing methods.

In the following sections, global approximations (or representations) of a signal using harmonic analysis technique and local approximations of a signal using the chromatic derivative technique are introduced in turn. Then a specific type of local approximation using chromatic derivatives associated with Chebyshev polynomials are introduced to demonstrate the chromatic derivative technique.

Global Approximations

Assume that f[t] is an absolutely integrable function, i.e., that $$\int_{-\infty}^{\infty} |f[t]|^2 dt < \infty,$$

and that its Fourier transform $H_f[\omega]$ is equal to 0 outside a finite interval. We can assume that the frequency variable $\omega$ is chosen so that $H_f[\omega]=0$ outside the interval $[-\pi, \pi]$. Then $$f[t] = \frac{1}{2\pi} \int_{-\pi}^{\pi} H_f[\omega] e^{i\omega t} d\omega,$$

and $$\int_{-\infty}^{\infty} |f[t]|^2 dt = \frac{1}{2\pi} \int_{-\pi}^{\pi} \|H_f[\omega]\|^2 d\omega.$$

To represent a band-limited function one can decompose its Fouierr transform into series. The most fundamental such decomposition results in Nyquist's Theorem. In this case a Fourier transform is represented by a Fourier series. Since $$\int_{-\infty}^{\infty} |f[t]|^2 dt = \frac{1}{2\pi} \int_{-\pi}^{\pi} \|H_f[\omega]\|^2 d\omega < \infty,$$

and since $H_f[\omega]=0$ outside the interval $[-\pi, \pi]$, $H_f[\omega]$ can be expanded into Fourier series:

$$H_f[\omega] = \sum_{k=-\infty}^{\infty} C_k e^{-ik\omega}$$

for $$C_k = \frac{1}{2\pi} \int_{-\pi}^{\pi} H_f[\omega] e^{i\omega k} d\omega = f[k].$$

Thus $$f[t] = \frac{1}{2\pi}\int_{-\pi}^{\pi} H_f[\omega]e^{i\omega t}\,d\omega$$

$$= \frac{1}{2\pi}\int_{-\pi}^{\pi}\sum_{k=-\infty}^{\infty} f[k]e^{-ik\omega}e^{i\omega t}\,d\omega$$

$$= \frac{1}{2\pi}\sum_{k=-\infty}^{\infty} f[k]\int_{-\pi}^{\pi} e^{-ik\omega}e^{i\omega t}\,d\omega$$

$$= \sum_{k=-\infty}^{\infty} f[k]\frac{1}{2\pi}\int_{-\pi}^{\pi} e^{i\omega(t-k)}\,d\omega$$

$$= \sum_{k=-\infty}^{\infty} f[k]\frac{1}{2\pi}\int_{-\pi}^{\pi} e^{i\omega(t-k)}\,d\omega$$

$$= \sum_{k=-\infty}^{\infty} f[k]\frac{\sin[\pi(t-k)]}{\pi(t-k)}.$$

It can be shown that he convergence in the sense of $L^2(R)$ implies also the pointwise convergence. For $$f[t] = \sum_{k=-\infty}^{\infty} f[k]\frac{\sin[\pi(t-k)]}{\pi(t-k)}$$

the absolute integrabity condition $$\int_{-\infty}^{\infty} |f[t]|^2\,dt < \infty,$$

due to orthonormality of the base $$\left\{\frac{\sin[\pi(t-k)]}{\pi(t-k)}\right\}_{k\in\mathbb{Z}},$$

is equivalent to the condition $$\sum_{k=-\infty}^{\infty} f[k]^2 < \infty.$$

Notice that if $$\sum_{k=-\infty}^{\infty} f[k]^2$$

does not converge, then $$\sum_{k=-\infty}^{\infty} f[k]\frac{\sin[\pi(t-k)]}{\pi(t-k)}f[k]$$

might not converge either, even if f[t] is bounded. For example, let $g[k]=(-1)^k$; then $$\sum_{k=-\infty}^{\infty} \frac{\sin\left[\pi\left(\frac{1}{2}-k\right)\right]}{\pi\left(\frac{1}{2}-k\right)}g[k] = \sum_{k=-\infty}^{\infty} \frac{(-1)^k(-1)^k}{\pi\left(\frac{1}{2}-k\right)}$$

$$= \sum_{k=-\infty}^{\infty} \frac{1}{\pi\left(\frac{1}{2}-k\right)}$$

does not converge. This shows the truly global nature of the Nyquist interpolation formula: the truncation error can be bounded only in terms of energy outside the truncation interval:

$$\sum_{|k|>N}\frac{\sin[\pi(t-k)]}{\pi(t-k)}f[k] \le \sqrt{\sum_{|k|>N} f[k]^2}$$

In the above representation, the Fourier transform $H_f[\omega]$ of f was expanded into series. Thus, the expansion was valid for every t Local Approximations Generalized Representation of Signals for CSP We now consider chromatic derivatives associated with an arbitrary family of polynomials of appropriate type. Let $$f[t] = \frac{1}{2\pi}\int_{-\pi}^{\pi} H_f[\omega]e^{i\omega t}\,d\omega$$

be a representation of a signal f by its Fourier transform. Then the usual differentiaton gives $$f'[t] = \frac{1}{2\pi}\int_{-\pi}^{\pi} i\omega H_f[\omega]e^{i\omega t}\,d\omega.$$

Thus, an application of a linear differential operator $$D[n,f] = \sum_{m=0}^{n} \frac{q_m}{\pi^m}(\partial/\partial t)^m$$

of order n to the input signal produces a multiplicative factor in the Fourier transform of the signal which is a polynomial $P_n[i\omega/\pi]$:

$$D[n,f][t] = \frac{1}{2\pi}\int_{-\pi}^{\pi} P_n[i\omega/\pi]H_f[\omega]e^{i\omega t}\,d\omega.$$

A family of differential operators is a Chromatic differentiation family, if the corresponding family of polynomial multiplicative factors $P_n[i\omega]$ satisfies some special properities.

We say that system of polynomials $P_n$ feasibly separates points on $[-\pi, \pi]$ if for every two numbers x and y such that $x\ne y$, x, $y\in[-\pi, \pi]$ there is a polynomial $$P_n\left[\frac{\omega}{\pi}\right]$$

in the system of arbitrary large degree, such that for $$M = \text{Max}\left\{P_n\left[\frac{\omega}{\pi}\right], -\pi \le \omega \le \pi\right\},$$

it holds that $$\left|P_n\left[\frac{x}{\pi}\right] - P_n\left[\frac{y}{\pi}\right]\right| \geq \frac{M}{k}|x-y|,$$

for a nonzero, yet reasonably small positive number k.

Thus, it is not the case that all polynomials in the system with high index attain small values for all points within an interval inside the interval $[-\pi, \pi]$.

A family of differential operators is a Chromatic differentiation family, if the corresponding family of polynomial multiplicative factors $P_n[i\omega]$ feasibly separates points. This insures that the family preseves the spectral features of the signal since at no part of the spectrum all of the polynomials have excessively small values.

The main example of polynomials which feasibly separate points are orthogonal polynomials.

Thus, we chose a continuous, non negative, even functon w[t], (i.e. such that w[t]=w[-t]) which has finitely many zero in $[-\pi, \pi]$, and such that $$\int_{-\pi}^{\pi} w[t] P[t/\pi] dt$$

converges for every polynomial. Then $$\langle f, g \rangle = \int_{-\pi}^{\pi} w[t] f[t] g[t] dt$$

is a scalar product on the vector space of all functions f such that $$\int_{-\pi}^{\pi} w[t] f[t]^2 dt$$

exists. Linear independence of polynomials 1, x, $x^2$, ..., $x^n$ ... and the Gram-Schmidt procedure guarantee the existence of a unique sequence of polynomials $SP=\{P_i\}_{i\in N}$ such that $$\int_{-\pi}^{\pi} w[t] P_i[t/\pi] P_j[t/\pi] dt = 0$$

for all $i \neq j$ and such that $$\int_{-\pi}^{\pi} w[t] P_i[t/\pi]^2 dt = h_i \neq 0 \text{ for each } i \geq 0.$$

As it is well known, any family of orthogonal polynomials of the form $P_n[t]=k_n t^n + k_n' t^{n-1} + \ldots$ satisfies the recursion formula obtained as follows.

Let $$b_n = \frac{k_{n+1}}{k_n}, \quad a_n = b_n\left(\frac{k_{n+1}'}{k_{n+1}} - \frac{k_n'}{k_n}\right) \text{ and } c_n = \frac{k_{n+1} k_{n-1} h_n}{k_n^2 h_{n-1}}.$$

Then $P_{n+1}[t]=(a_n+t\ b_n)P_n[t]-c_n P_{n-1}[t]$.

A system of polynomials on $[-\pi, \pi]$ is regular if
  i. The system contains exactly one polynomial for of each degree n (thus also a constant function);

ii. Polynomials $$P_{2k}\left[\frac{i\omega}{\pi}\right]$$

which belong to a regular family and are of even index contain only even powers of $i\omega$, while $$P_{2k+1}\left[\frac{i\omega}{\pi}\right]$$

which belong to a regular family and are of odd index contain only odd powers of $i\omega$. Thus, polynomials containing only even powers are real while the polynomials containing only odd powers are of the form i $Q[\omega]$ where Q is a real poynomial in $\omega$.

The significace of a regular systems comes from the fact that the Fourier transform of a real function has even real part and odd immaginary part.

In case of orthogonal polynomials if $a_n=0$, if $$\frac{k_{n+1}'}{k_{n+1}} = \frac{k_n'}{k_n}$$

for all n>0, and in addition also $k'_1=0$, these polynomials form a regular system, satisfying $P_0[t]=k_0 P_1[t]=k_1\ t$, and $P_{n+1}[t]=b_n\ t\ P_n[t]-c_n P_{n-1}[t]$.

To any regular set of orthogonal polynomials SP we associate a class SD of linear differential operators defined by the following recursion scheme.

Let $P_0[t]=k_0$ and $P_1[t]=k_1 t$. We set $\Delta_0[f]=k_0 f[t]$;

$$\Delta_1[f] = \frac{k_1}{\pi} \partial f[t]/\partial t;$$

$$\Delta_{n+1}[f] = \frac{b_n}{\pi} \partial_t(\Delta_n[f])[t] + c_n \Delta_{n-1}[f]. \text{ for } n \geq 1$$

A family of differential operators SD is a Chromatic differentiation family, for example, if the corresponding family of polynomial multiplicative factors $$P_n\left[\frac{i\omega}{\pi}\right]$$

is a regular family of orthogonal polynomials. As described in the Patent Disclosure "Signal Processing With Local Signal Behavior", Chebyshev and Legendre polynomials are typical examples of such polynomials, and there it is also explained why such polynomials encode the spectrum of the signal. From the same disclosure it is clear that the family 1, $$\frac{\omega}{\pi}, \left(\frac{\omega}{\pi}\right)^2, \ldots, \left(\frac{\omega}{\pi}\right)^n \ldots$$

does NOT feasibly separate points. The last condition ensures that the polynomials efficiently encode the spectral features of the signal rather than, e.g. accumulating the noise from the ends of the spectrum as it is the case with 1, $$\frac{\omega}{\pi}, \left(\frac{\omega}{\pi}\right)^2, \ldots, \left(\frac{\omega}{\pi}\right)^n \ldots.$$

Let $$B_0[t] = \frac{1}{2\pi} \int_{-\pi}^{\pi} w[\omega] e^{i\omega t} d\omega;$$

then we call $B_0[t]$ the fudamental basis funton of order 0 associated with a regular family of poynomials SP, orthogonal with respect to the scalar product $$\langle f, g \rangle = \int_{-\pi}^{\pi} w[t] f[t] g[t] dt.$$

Let also $B_n[t] = (-1)^n \Delta_n[B_0]$. Then $B_n[t]$ is called the fundamental basis function of order n.

An example of a regular system, heavily used in the presented embodiment of the subsequent Chromatic Signal Processing method, is the Chebyshev-type chromatic derivative system and it relies on the properties of this system listed below.

Chebyshev Polynomials and Chebyshev-type Chromatic Derivative System

Decomposing the Fourier transform of a function into Fourier series resulted in Nyquist's Theorem. Instead, in the equality $$f[t] = \frac{2}{\pi} \int_{-\pi}^{\pi} H_f[\omega] e^{i\omega t} d\omega$$

one can expand the factor $e^{i\omega t}$ into series. As an example of the mathematics behind our signal processing method, we use the fundamental basis of functions generated by the well-known regular series of orthogonal polynomials called the Chebyshev T polynomials. Let $T_k(x)$ (or equivalently T[k, x]) be the $k^{th}$ Chebyshev polynomial, and let $J_m(t)$ (or eqaivalently J[m, t]) be the $m^{th}$ Bessel function of the first kind. Then, the well known equalities $$\int_0^1 T_{2k+1}(\omega) \sin [a\omega] \frac{d\omega}{\sqrt{1-\omega^2}} = (-1)^k \frac{\pi}{2} J_{2k+1}(a) \text{ and}$$

$$\int_0^1 T_{2k}(\omega) \cos [a\omega] \frac{d\omega}{\sqrt{1-\omega^2}} = (-1)^k \frac{\pi}{2} J_{2k}(a)$$

hold for integers $k \geq 0$ and imply that $$A_k = \frac{2}{\pi} \int_{-\pi}^{\pi} T_{2k+1}\left(\frac{\omega}{\pi}\right) \sin [\omega t] \frac{d\omega}{\sqrt{1-(\omega/\pi)^2}} = (-1)^k J_{2k+1}(\pi t)$$

and $$B_k = \frac{2}{\pi} \int_{-\pi}^{\pi} T_{2k}\left(\frac{\omega}{\pi}\right) \cos [\omega t] \frac{d\omega}{\sqrt{1-(\omega/\pi)^2}} = (-1)^k J_{2k}(\pi t)$$

The series of Chebyshev polynomials $$T_k\left(\frac{\omega}{\pi}\right)$$

are orthogonal over $[-\pi, \pi]$ with the window $1/(\sqrt{1-(\omega/\pi)^2})$. Thus, $A_k$ and $B_k$ are coefficients of expansion of $\sin[\omega t]$ and $\cos[\omega t]$, respectively, in the series of Chebyshev T polynomials after nomializing. Hence, we can write:

$$\sin [\omega t] = 2 \sum_{k=0}^{\infty} A_k T_{2k+1}\left(\frac{\omega}{\pi}\right) = 2 \sum_{k=0}^{\infty} (-1)^k J_{2k+1}(\pi t) T_{2k+1}\left(\frac{\omega}{\pi}\right),$$

$$\cos [\omega t] = J_0(\pi t) + 2 \sum_{k=1}^{\infty} B_k T_{2k}\left(\frac{\omega}{\pi}\right) = J_0(\pi t) + 2 \sum_{k=1}^{\infty} (-1)^k J_{2k}(\pi t) T_{2k}\left(\frac{\omega}{\pi}\right),$$

This can ce shown to imply that for any fixed parameter $t_0$ and every t, $$f[t+t_0] = \frac{1}{2\pi} \int_{-\infty}^{\infty} H_f[\omega] e^{i\omega(t+t_0)} d\omega$$

$$= J_0(\pi t) f[t_0] + 2 \sum_{k=1}^{\infty} J_k(\pi t) \frac{1}{2\pi} \int_{-\infty}^{\infty} i^k T_k\left(\frac{\omega}{\pi}\right) H_f[\omega] e^{i\omega t_0} d\omega$$

Since $$T_m\left(\frac{\omega}{\pi}\right)$$

are polynomials, the above factors $$\frac{1}{2\pi} \int_{-\infty}^{\infty} i^m T_m\left(\frac{\omega}{\pi}\right) H_f[\omega] e^{i\omega t_0} d\omega$$

are values of linear differential operators applied to f[t] and then evaluated at $t=t_0$.

Due to their properties we call these differential operators Chromatic Derivatives of Chebyshev type.

The stability of the expansion follows from the stnd theory of orthogonal functions (e.g., the uniqness of approximation coefficients) because Bessel functions form an othogonal system.

$\{J_m[t]: m \in N\}$ is an orthogonal system in the space of all $\pi$ band limited functions $$\int_{-\pi}^{\pi} H_f[\omega] \overline{H_f[\omega]} \sqrt{1-\left(\frac{\omega}{\pi}\right)^2} d\omega = \int_{-\pi}^{\pi} \|H_f[\omega]\|^2 \sqrt{1-\left(\frac{\omega}{\pi}\right)^2} d\omega$$

converges, where again $H_f[\omega]$ is the fourier transform of f, and with the scalar product defined by $$\langle\langle f, g \rangle\rangle = \frac{1}{2\pi} \int_{-\pi}^{\pi} H_f[\omega] \overline{H_g[\omega]} \sqrt{1-\left(\frac{\omega}{\pi}\right)^2} d\omega.$$

It can be shown that this is a correct definition of a scalar product.

This space properly extends the space of $\pi$ band limited square integrable functions; obviously it includes all the Bessel functions $\{J_m[t]: m \in N\}$.

The orthogonality, in particular implies that expansions of lower order are just the truncations of expansions of higher order. The Chebyshev polynomials (frequency domain) and the Bessel functions (time domain) form a very tighty-linked pair for performing signal processing on bandlimited signals. In practice we will find a series of useful corponding time domain basis functions tied to any regular, orthogonal frequency-domain polynomials that we choose.

Chromatic Derivatives associated with the Family of Chebyshev Polynomials

These differential operators were introduced in the patent "Signal Processor With Local Signal Behavior".

Let f(t) be an arbitrary function; then the values of the operators on $N \times C^\infty \to C^\infty$ defined below are called the CHROMATIC DERIVATIVES of f(t) associated with the family of Chebyshev polynomials $$T_n\left(\frac{\omega}{\pi}\right).$$

$CD_{Chebyshev}[0, f] = f;$ $$CD_{Chebyshev}[1, f] = \frac{1}{\pi}(\partial CD_{Chebyshev}[0, f]/\partial t);$$

$$CD[k, f] = \frac{2}{\pi}(\partial CD_{Chebyshev}[k-1, f]/\partial t) + CD_{Chebyshev}[k-2, f]$$

for $k \geq 2$.

$(CD_{Chebyshev}[k, f])[t]$ will be denoted by $CD_{Chebyshev}[k, f, t]$ and simpler by $CD[k, t]$ if it is clear what the input function f is and what family of polynomials is used Properties Of Chromatic Derivatives Associated with Chebyshev Polynomials Chromatic Derivatives associated with Chebyshev polynomials have several important properties. These properties are summarized below.

The formula relating the Chromatic Derivatives of a signal to the signal's specime is:

If $f[t] = \frac{1}{2\pi}\int_{-\pi}^{\pi} H_f[\omega]e^{i\omega t}\,d\omega$ then $$(CD[k, f])[t] = \frac{1}{2\pi}\int_{-\pi}^{\pi} i^n T_k\left[\frac{\omega}{\pi}\right] H_f[\omega]e^{i\omega t}\,d\omega.$$

Expansions of Band-Limited Signals in Terms of Chromatic Derivatives Associated with Chebyshev Polynomials The following list of formulas's exact forms are special to the Chebyshev-Bessel expansion, but analogous equations can be computed for any such orthogonal polynomial—basis function pair by using simple properties particular to each such pair. The expansion is a novelty first presented herein.

We can formulate a "Taylor-Chebyshev-Bessel" type expansion formula. Since, as shown above, $$f[t+t_0] = J_0(\pi t)\frac{1}{2\pi}\int_{-\infty}^{\infty} H_f[\omega]e^{i\omega t_0}\,d\omega +$$

$$2\sum_{k=1}^{\infty} J_{2k}(\pi t)\frac{1}{2\pi}\int_{-\infty}^{\infty} i^{2k}T_{2k}\left(\frac{\omega}{\pi}\right) H_f[\omega]e^{i\omega t_0}\,d\omega +$$

$$2\sum_{k=0}^{\infty} J_{2k+1}(\pi t)\frac{1}{2\pi}\int_{-\infty}^{\infty} i^{2k+1}T_{2k+1}\left(\frac{\omega}{\pi}\right) H_f[\omega]e^{i\omega t_0}\,d\omega$$

we obtain, once more, that $$f[t+t_0] = f[t_0]J_0(\pi t) + 2\sum_{k=1}^{\infty} CD[k, f, t_0]J_k(\pi t).$$

setting $t+t_0 = \bar{t}$ we get the more usual form $$f[\bar{t}] = f[t_0]J_0(\pi(\bar{t}-t_0)) + 2\sum_{k=1}^{\infty} CD[k, f, t_0]J_k(\pi(\bar{t}-t_0)).$$

We now briefly review basic properties of Chromatic differentiation.

Composition of Chromatic Derivatives Associated with Chebyshev Polynomials $CD[m, CD[n, f]] = \frac{1}{2}(CD[m+n, f] + (-1)^{MIN[m,n]}CD[|m-n|, f]);$ Chromatic Derivatives of Bessel Functions 1. $CD[m, J_0[\pi t]] = (-1)^m J_m[\pi t] = J_{-m}[\pi t];$ 2. $CD[m, J_n[\pi t]] = (-1)^m \dfrac{J_{m+n}[\pi t] + (-1)^{\text{Min}[m,n]}J_{|m-n|}[\pi t]}{2};$ Thus, we can show that for any bandlimited function f, $$f[t] = f[t_0]J_0[\pi(t-t_0)] +$$

$$2\sum_{k=1}^{\infty} CD[k, f, t_0]J_k[\pi(t-t_0)]$$

$$= f[t_0]J_0(\pi(t-t_0)) +$$

$$2\sum_{k=1}^{\infty} (-1)^k CD[k, f, t_0]CD[k, J_0[\pi(t-t_0)], t]$$

While the global representation of F[t] is obtained by representing the Fourier transform H[ω] by a Fourier series, the local representation is obtained by representing $e^{i\omega t}$ as a series of Chebyshev polynomials in the frequency variable ω with multiples of Bessel functions of time as coefficients:

$$e^{i\omega t} = J_0[\pi t]T\left[0, \frac{\omega}{\pi}\right] + \sum_{i=1}^{\infty} 2J_n[\pi t]T\left[n, \frac{\omega}{\pi}\right]i^n$$

$$= J_0[\pi t] + \sum_{i=1}^{\infty} 2J_n[\pi t]T\left[n, \frac{\omega}{\pi}\right]i^n$$

in the base consisting of Chebyshev polynomials.

The difference in local and global representation is manifested in the nature of the convergence of the series. The error of truncated local approximation can be shown to be estimated as follows.

$$(\text{Err}[f, \bar{t}])_m^2 \equiv \left(f[\bar{t}] - f[t_0]J_0(\pi(\bar{t}-t_0)) - \right.$$

$$\left. 2\sum_{k=1}^{m} CD(k, f, t_0)J_k(\pi(\bar{t}-t_0))\right)^2$$

$$= \leq A\left(1 - J_0[\pi(\bar{t}-t_0)]^2 - \sum_{s=1}^{m} 2J_s[\pi(\bar{t}-t_0)]^2\right)$$

where A is a constant which depends upon the energy of the signal. Analogous Taylor-type approximation estimates can be derived from any series of basis functions we so choose to use.

Expansions of Chromatic derivatives of Band-Limited Signals

There are two ways of expanding chromatic derivatives. These two ways are summarized in the two formulas below:

Formula A: (obtained by chromatic differentiation of the chromatic expansion of the signal)

Let f[t] be a band-limited signal of finite energy, i.e. an absolutely integrable function whose Fourier transform is 0 outside the interval $[-\pi, \pi]$. Then $$CD[n, f, t] \approx (-1)^n (f[t_0]J_n[\pi(t-t_0)] +$$

-continued $$\sum_{m=1}^{\infty} CD[m, f, t_0](J_{n+m}[\pi(t-t_0)] +$$

$$(-1)^{\text{Min}[m,n]} J_{|n-m|}[\pi(t-t_0)])).$$

Formula B: (obtained by chromatic differentiation of the signal and then forming its chromatic expansion)
Let f[t] be as in the previous formula. Then $$CD[n, f, t] \approx CD[n, f, t_0] J_0[\pi(t-t_0)] +$$

$$\sum_{k=1}^{\infty} (CD[n+k, f, t_0] +$$

$$(-1)^{\text{Min}[n,k]} CD[|n-k|, f, t_0]) J_k[\pi(t-t_0)]$$

It is easy to see that reordering of terms in the experession $$CD[n, f, t] \approx (-1)^n (f[t_0] J_n[\pi(t-t_0)] +$$

$$\sum_{m=1}^{M} CD[m, f, t_0](J_{m+n}[\pi(t-t_0)] +$$

$$(-1)^{\text{Min}[m,n]} J_{|m-n|}[\pi(t-t_0)]))$$

results in an expression of the form $$CD[n, f, t_0] J_0[\pi(t-t_0)] +$$

$$\sum_{m=1}^{M-n} (CD[m+n, f, t_0] + (-1)^{\text{Min}[m,n]} CD[|m-n|, f], t_0) J_m[\pi(t-t_0)] + R[t],$$

where R[t] contains only Bessel functions of high degree. This demonstrates (recall that Bessel functions of high degree have small values around t=0) that the approximation $$f[t] \approx f[t_0] J_0[\pi(t-t_0)] + 2 \sum_{m=1}^{M} CD[m, f, t_0] J_m[\pi(t-t_0)]$$

has the property that its chromatic derivatives of order n are good approximations of order M-n of the chromatic derivatives of order n of the function f.

Chromatic Signal Processing

In the following sections, Fundamental procedures and systems of the Chlomatic Signal Processing methods are described in detail. These procedures can be classified as either (I) Data Acquisition Procedures or (II) Signal Processing Procedures.

(I) Data Acquisition Procedures

This data acquisition stage (the stage by which we obtain the local signal behavior parameters) preferably but not necessarily takes place in a dedicated data acquisition unit. The reason is that the data acquisition unit (hereafter, DAU) performs the same operation for any subsequent type of processing and thus should be performed in an unit which needs no programming specific to the subsequent processing. The only possible programming of the DAU is adaptation woth respect to the bandwidth of the input signal and the out of band noise level present in the signal.

The unit can be embodied in either of the following ways:
(i) by first sampling the analog signal at higher than the Nyquist rate, and then obtaining local signal behavior parameters from either a) the numerical values of the samples (if an oversampling A/D convertor is used; b) from discrete but analog voltages (if, for example, a CCD device is used);
(ii) by using analog or mixed signal circuitry to perform an operation needed to obtain the values of the local signal behavior parameters from the continuous form of the lignal (e.g. by analog or mixed signal multiplication of the imput signal with a specific function (as described herein) followed by analog integration) and then sampling the output of the circuit at the appropriate sampling moments, usually at a sub-Nyquist rate. The signal may be given in the presence of severe additive out of band noise (for example the switching noise of a pulse width modulator), in which case f(t) represents the signal plus the noise; the approximations are intrinsically noise robust and will pick-out the π-band-limited part of f(t), as desired, filtering out the out of band noise.

Figure 2A:
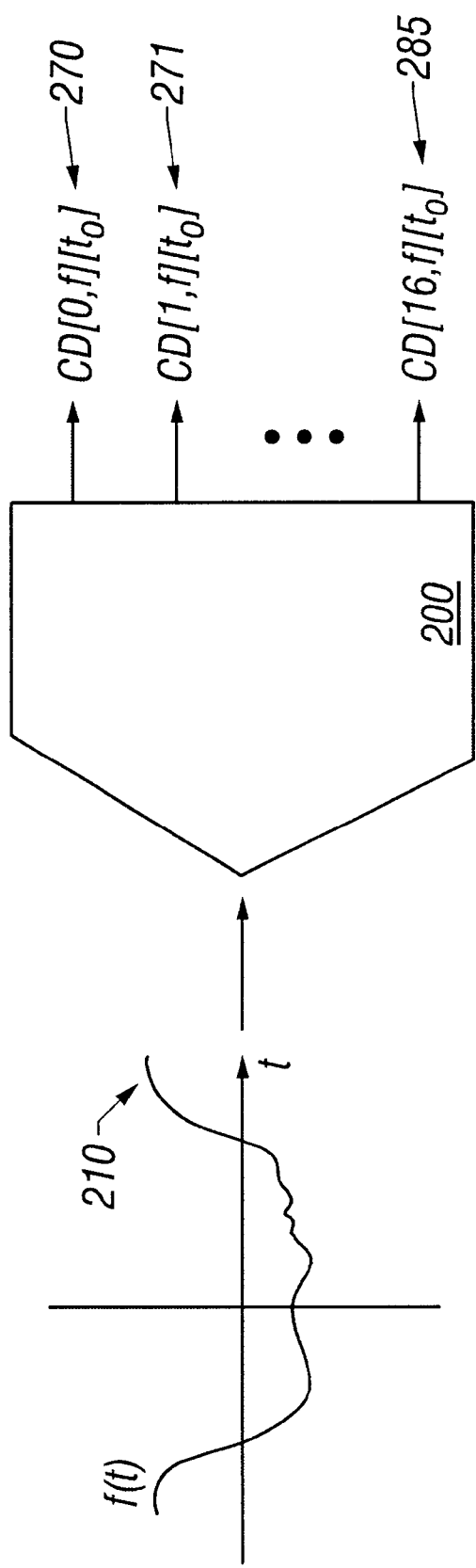
FIG. 2A depicts an A/D converter in accordance with one embodiment of the invention.

Referrng now to FIG. 2A, a DAU 200 is depicted in accordance with one embodiment of the present invention. An input signal 210 as the input of DAU 200 is processed by DAU 200. The output for this example is 16 local signal behavior parameters 270–285. In this case, each of these output parameters 270–285 is a value of a chromatic derivative evaluated at a sampling moment. As understood herein, a DAU need not be limited to 16 outputs.

The data acquisition procedures employed can be broadly classified by the method they use as approximation techniques. In one embodiment of the invention, approximation technique is specialized to least square fitting. However, in an alternative embodiment, other types of curve fitting can be implemented.

(I) Basic Least Square Fit Approximations

Basic least square fit approximations use finite linear combinations of interpolation functions $\{a_1[t], a_2[t], \ldots, a_k[t]\}$ which within a given neighbourhood $[t_0-\delta, t_0+\delta]$ of the central point of approximation $t_0$ satisfy:

1) Each $a_i[t]$ "locally resembles" a band-limited function, i.e., for some band-limited function b[t], $|a_i[t]-b[t]| \leq \epsilon$ for some small given $\epsilon$ and all t such that $t_0-\delta \leq t \leq t_0+\delta$.
2) Functions $\{a_1[t], a_2[t], \ldots, a_k[t]\}$ allow stable numerical differentiation of any degree.
3) The set $\{a_1[t], a_2[t], \ldots, a_k[t]\}$ is sufficient as a "local basis", i.e., for every band-limited function f[t] there exists a linear combination $A_1 a_1[t] + A_2 a_2[t] + \ldots + A_k a_k[t]$, such that $|A_1 a_1[t] + A_2 a_2[t] + \ldots + A_k a_k[t] - f[t]| \leq \xi[t_0-t]$ for all t such that $t_0-\delta \leq t \leq t_0+\delta$, where $\xi[t]$ is an error function, associated with the family $\{a_1[t], a_2[t], \ldots, a_k[t]\}$, and which has small values around 0. As such, interpolation functions $a_1[t], a_2[t], \ldots, a_k[t]$ can also be considered as basis functions.

Since only BL functions can be approximated, the approximations can serve to remove noise from a noisy signal. These basic approximations can be made using various basis functions; the patent disclosure "Signal Processing With Local Signal Behavior" describes application of a Lagrangian-type polynomials. Specifically, for the case of Lagrangian-type interpolation polynomials in the neighbourhood [−1,1] a good error estimate is $$\frac{e^{\frac{-t^2}{N}}}{\sqrt{1-\left(\frac{t}{N}\right)^2}}$$

for a suitably chosen N depending on the interpolation polynomials used, as described in the invention "Signal Processing With Local Signal Behavior". As another example of local, interpolatory basis functions, the present embodiment uses Bessel functions which are band-limited functions but of infinite energy. Specifically, for interpolations which use Bessel functions of order up to N, an error estimate can be written in the form $$c\sqrt{1 - J_0[t]^2 - 2\sum_{i=1}^{N} J_i[t]^2}.$$

Thus, the present embodiment improves on the previous by having an error bound which remains very small for a larger interval near the center of approximation (in the above case, 0).

Again, in comparison with the procedure of the the Patent Disclosure "Signal Processing With Local Signal Behavior", for a signal f, if the Lagrangian approximation of size N is large enough, we get that for all sufficiently small t:

$$\left| \sum_{j=-N}^{N} L_j^{2N+1}[t] f[j] - f[t] \right| \le \frac{A}{\sqrt[4]{N}}$$

where the constant A depends upon the energy of the signal f. Numerically comparng the two kinds of approximations make it clear that approximations using Bessel functions with Chebyshev type Chromatic derivatives converge at much faster rate than approximations using Lagrangian functions (interpolating shifted sinc functions) with Chebyshev type Chromatic derivatives.

In addition to having a superior convergence rate, using Bessel basis function approximations of bandlimited signals instead of Lagrangian interpolations of those signals is superior for the following reasons:

a) Bessel expansions of a bandlimited signal are more accurate; fewer degrees of expansion and fewer centers for expansion are needed to obtain the same accuracy in approximating an extended slice of a signal.

b) Bessel approximations (and other fundamental basis functions) are stable as one moves out from the center of the approximation—for example, asymptotically ($x \to \infty$) Bessel functions converge to 0 as $1/\sqrt{x}$, whereas polynomials asymptotically are governed by the largest term in the polynomial: $x^N \to$ they increase rapidly and without a bound.

c) Accurate higher order derivatives are available using Bessel expansion approximations compared to the Lagrangian interpolations of sinc functions.

d) Lower order Chromatic derivatives of a signal at a point are approximately the same whether one is also obtaining much higher order Chromatic derivatives during differentiation or not: Lagrangian interpolation parameters do not have this "degree-ofdifferentiation invariance".

The error estimates we have provided when representing a signal using fundamental basis functions from 0 to n can be used to define suitable windowing (weight) functions for the least square fit approximations. We provide the details below for the two special cases of the Bessel function interpolants and the sinc function interpolants, although any class of fundamental basis functions could be used Type 1: Bessel functions as interpolation functions Suppose that one begins with 8-times oversampled data. To obtain a least square fit, one considers the following sum:

$$S = v\sum_{k=1}^{N} A(k)^2 + u\sum_{i=-M}^{M} W\left[\frac{i}{8}\right]^2 \left(J_0\left[\frac{\pi i}{8}\right]A(0) + 2\sum_{k=1}^{N} J_k\left[\frac{\pi i}{8}\right]A(j) - f\left[\frac{i}{8}\right]\right)^2;$$

Here v, u are constants (v possibly equal to 0) and W[t] is the following windowing function obtained from the error estimate for approximations using Bessel functions.

$$W[t] = \frac{a+1}{a^2}\left(\sqrt{1 - J_0[\pi t]^2 - 2\sum_{k=1}^{N} J_k[\pi t]^2} + \frac{1}{a}\right)^{-1} - \frac{1}{a+1}$$

The first sum provides noise robustness, by reducing aliasing between Bessel functions of different order. Bessel functions are independent on $[-\infty, \infty]$, but in a finite interval clearly an aliasing phenomenon is inevitable. However, if all the coefficients A(k) of the linear combination are kept small, the properties of Bessel functions around 0 ensure that very small error will be due to such aliasing. Aliasing is due to the fact that one Bessel function can be approximated by a linear combination of other Bessel functions, with small error over the interval of interest.

The sum $$\sum_{i=-M}^{M}\left(J_0\left[\frac{\pi i}{8}\right]A(0) + 2\sum_{k=1}^{N} J_k\left[\frac{\pi i}{8}\right]A(k)\right)$$

is an interpolation evaluated at 8 times oversampled points in the interval $$\left[-\frac{M}{8}, \frac{M}{8}\right]$$

consisting of $$\frac{M}{4}$$

Nyquist rate unit intervals. M is the greatest integer such that $$\frac{M}{8} < m,$$

where W[m] is the first local minimum of W[t] for t>0. (I.e., $$\frac{M}{8}$$

is the last oveasampling point inside of the monotonically decreasing part of W[t].)

Thus, $$\sum_{i=-M}^{M} W\left[\frac{i}{8}\right]^2\left(J_0\left[\frac{\pi i}{8}\right]A(0) + 2\sum_{k=1}^{N} J_k\left[\frac{\pi i}{8}\right]A(k) - f\left[\frac{i}{8}\right]\right)^2$$

corresponds to the sum of squares of the differences of the interpolated values $$\sum_{i=-M}^{M}\left(J_0\left[\frac{\pi i}{8}\right]A(0) + 2\sum_{k=1}^{N}J_k\left[\frac{\pi i}{8}\right]A(k)\right)$$

and (8 times over-) sampled values of the signal f[t], windowed by W[t], corresponding to the error of the interpolation, thereby "equalizing" the umerical significance of differences between the sampled and extrapolated value. In this way, allowing correspondingly larger errors away from the center in the same way that the accuracy of interpolation decreases, the least squares produces the best approximations A(j) of the values of the corresponding Chromatic derivatives CD[j, f][0]. Of course, one can use any oversampling rate: 8 is just an example. Also, the sampling interval does not need to be symmetric about 0.

The total sum is then minimized using the standard numerical techniques consisting of differentiation of the sum S with respect to the variables A(i) (here i is an index and not a variable) and setting all partial derivatives equal to 0, thus obtaining a system of linear equations, which can be solved for the variables A(i). The resulting expression is of the form $$\sum_{i=-M}^{M} c_i f\left(\frac{\pi i}{8}\right).$$

The coefficients $c_i$ are obtained from thvalues of Bessel functions at sampling pints and do no the input signal.

If one wishes to perform the curve fitting with the continuous signal (rather than with samples), the above summation is simply replaced by the integral below. We take [−m,m] to be the integraion interval, measured in Nyquist intervals, where m can be taken such that W[m] is the first local minimum of W[t] greater than 0. (Of course, this is just one possible choice.)

$$S = v\sum_{k=1}^{N}(A(k))^2 + u\int_{-m}^{m}W[t]^2\left(J_0[\pi t]A(0) + 2\sum_{k=1}^{N}J_k[\pi t]A(j) - f[t]\right)^2 dt$$

S is minimized exactly as in the previous method, resulting again in a set of linear equations which can be solved for the values of the chromatic derivatives. Each will now be an integral of the form $$\int_{-m}^{m} f(t)\overline{J}(t)dt$$

for some function $\overline{J}$ as previously. This integral can be computed using analog or mixed signal circuitry; its value will then need to be sampled at the appropriate point in time to obtain the value of the chromatic derivative. This sample only needs to be taken once per integration interval. An example is given in FIG. 2B.

Figure 2B:
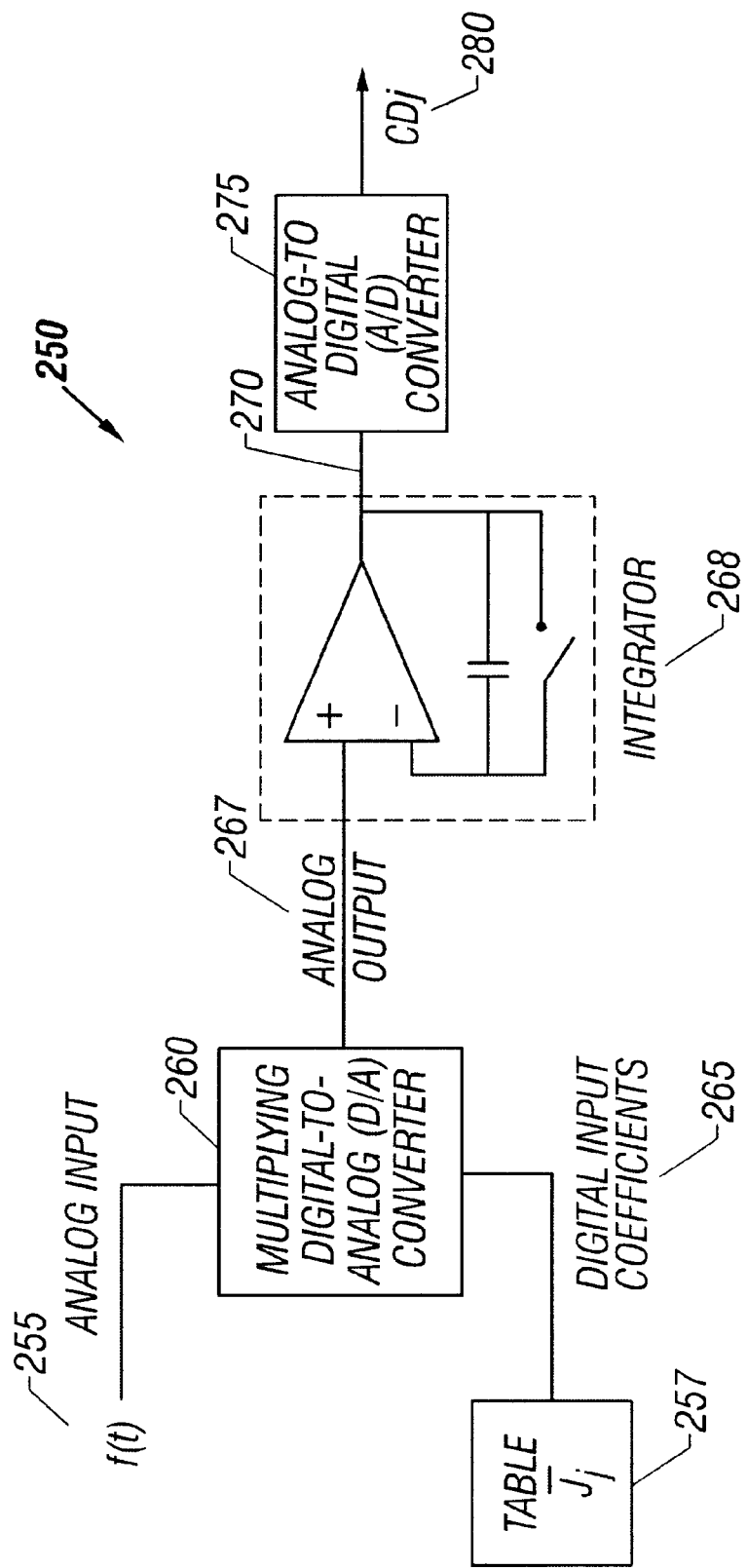
FIG. 2B depicts a schematic diagram of analog/mixed-signal circuitry for performing curve fitting in accordance with one embodiment of the invention.

Referring now to FIG. 2B, a schematic diagram of analog/mixed-signal circuitry 250 is shown for performing curve fitting in accordance with one embodiment of the invention. As shown, a multiplier 260 takes an analog signal input f(t) 255 as a reference voltage. In the present embodiment, multiplier 260 is a D/A converter. In addition, a table 257 of predetermined numbers is coupled to multiplier 260. Table 257 provides these predetermined numbers as a set 265 of digital input coefficients to be combined with analog signal input f(t) 255 by multiplier 260 for producing an analog output 267. An integrator 268 is coupled to multipler 260. Integrator 268 takes analog output 267 from multiplier 260 as an input and produces therefrom a signal 270. In turn, signal 270 is received by an A/D converter coupled to integrator 268. $CD_j$, the value of the jth order Chromatic derivative of f(t) 255 evaluated at a sampling moment $t_0$, is outputed from A/D converter 275.

Referring still to FIG. 2B, one CD (i.e., $CD_j$) of a particular order is produced as the output of circuitry 250. However, as understood herein, circuitry 250 need not be limited to producing CD of just one particular order such as j. For example, in another embodiment, by combining delays with circuitry 250, different orders of CDs can be produced as sequential outputs of circuitry 250. However, as understood herein, multiple copies of circuitry 250 can also be implemented. For example, in an alternative embodiment, multiple copies of circuitry 250 are arranged in parallel to provide multiple CDs as parallel outputs.

Figure 3:
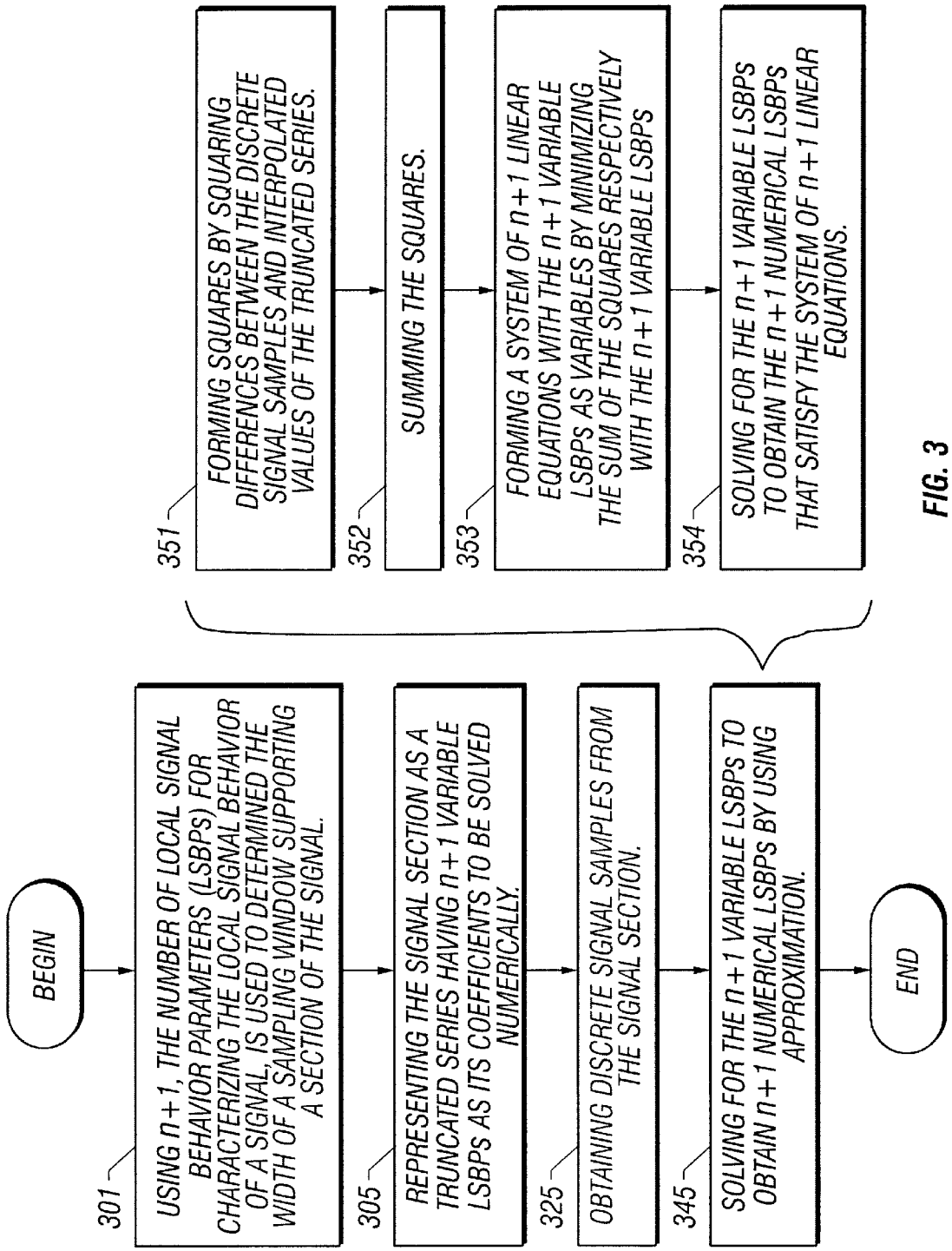
FIG. 3 is a flow chart outining steps for coding a signal section within a sampling window in accordance with one embodiment of the invention.

Referring now to FIG. 3, a flow chart 300 is shown outlining steps for digitizing a section of a BL analog signal within a sampling window in accordance with one embodiment of the invention. In particular, flow chart 300 outlines steps for implementing the introduced mathematical concepts in accordance with one embodiment of the invention.

In step 301, (n+1), the number of LSBPs that will be used to characterize the local behavior of the section in between Nyquist rate points, is used to determine the width of a sampling window.

In step 305, the section is represented as a truncated series at a sampling moment within said sampling window. This truncated series has n+1 variable LSBPs as its coefficients to be solved numerically. This truncated series also has n+1 basis functions that are fundamental basis functions of order 0 to order n. Typically, these fundamental basis functions can be Bessel functions of order 0 to order n. Also, these fundamental basis functions can be Sinc functions.

In step 325, discrete signal samples are obtained by over-sampling the section within said sampling window. The over-sampling process can also be performed within an interval lying within the sampling window. In another embodiment, the over-sampling process is performed in the entire sampling window.

In step 345, by using an approximation technique for the truncated series and the discrete signal samples, the n+1 variable LSBPs are solved numerically to obtain n+1 numerical LSBPs. Specifically, in one embodiment where the approximation technique is least sqaure fitting, the numerical LSBPs are solved by the least square fitting of the truncated series with the discrete signal samples.

Also in step 345, the n+1 numerical LSBPs are values of n+1 chromatic differential operators of order 0 to order n evaluated at the sampling moment. These n+1 chromatic differential operators of order 0 to order n are associated respectively with regular polynomials of order 0 to order n, wherein said n+1 regular polynomials feasibly separate points. In one embodiment, the regular polynomials are Chebyshev polynomials of order 0 to order n. In another embodinent, the regular polynomials are Legendre polynomials of order 0 to order n.

Referring still to FIG. 3, Step 345 can be further refined into smaller steps such as step 351–354. Specifically, In step 351, squares are formed by squaring differences between the discrete signal samples and interpolated values of the truncated series.

In step 352, the squares are summed.

In step 353, a system of n+1 linear equations with said n+1 variable LSBPs as variables is formed by minimizing the sum of the squares respectively with said n+1 variable LSBPs.

In step 354, solving for said n+1 variable LSBPs to obtain said n+1 numerical LSBPs that satisfy said system of n+1 linear equations.

The following facts may be used to improve the accuracy of the above method. We present it here for the continuous case (using integration), but it can be done for discrete samples as well. Also, the method is not restricted to Bessel functions as interpolants, but can also be used with other fundamental basis functions. Let us denote by $K_m[t]$ the $m^{th}$ Chromatic derivative of the Sinc[t] function, i.e., for $$\mathrm{sinc}[t] = \frac{\sin[\pi t]}{\pi t} = K_0[t].$$

We have $$CD[m, K_0[t]] = K_m[t]$$

$$= \frac{1}{2\pi} \int_{-\pi}^{\pi} i^m T_m\left[\frac{\omega}{\pi}\right] e^{i\omega t} d\omega;$$

Let also $$f[t] = \frac{1}{2\pi} \int_{-\pi}^{\pi} H_f[\omega] e^{i\omega t} d\omega.$$

Then $$(-1)^m \int_{-\infty}^{\infty} f[u] K_m[u] du = \int_{-\infty}^{\infty} f[u] K_m[0 - u] du$$

$$\left( = \int_{-\infty}^{\infty} f[u] K_m[t - u] du \right)\bigg|_{t=0}$$

$$= (f[t] * K_m[t])[0]$$

$$\left( = \frac{1}{2\pi} \int_{-\pi}^{\pi} H_f[\omega] i^m T_m\left[\frac{\omega}{\pi}\right] e^{i\omega t} d\omega \right)\bigg|_{t=0}$$

$$= CD[m, f][0]$$

Let now $$\Theta[t] = CD[0, f][0] J_0[t] + 2 \sum_{k=1}^{N} CD[k, f][0] J_k[t];$$

then $$(J_n[t] * K_m[t])[0] = \frac{1}{2\pi} \int_{-\pi}^{\pi} i^m T_m\left[\frac{\omega}{\pi}\right] \frac{(-i)^n \frac{2}{\pi} T_n\left[\frac{\omega}{\pi}\right]}{\sqrt{1 - \left(\frac{\omega}{\pi}\right)^2}} e^{i\omega 0} d\omega$$

$$= \frac{2}{\pi} \frac{1}{2\pi} \int_{-\pi}^{\pi} \frac{(-1)^n i^{m+n} T_m\left[\frac{\omega}{\pi}\right] T_n\left[\frac{\omega}{\pi}\right]}{\sqrt{1 - \left(\frac{\omega}{\pi}\right)^2}} d\omega$$

This implies $(K_m[t]*J_n[t])[0]=0$ if $m \neq n$; and $(K_m[t]*J_m f[t])[0]=\lambda_m$. Here $\lambda_m=1$ if $m=0$ and $\lambda_m=\frac{1}{2}$ otherwise.

Consequently, $$(K_m[t] * \Theta[t])[0] =$$

-continued $$CD[0, f][0](J_0(t) * K_m[t])[0] + 2 \sum_{k=1}^{N} CD[k, f][0](J_k(t) * K_m[t])[0]$$

and so $$(K_0[t]*\Theta[t])[0]=CD[0, f][0](J_0(t)*K_0[t])[0]=CD[0, f][0],$$

and $$(K_m[t] * \Theta[t])[0] =$$

$$2 CD[m, f][0](J_m(t) * K_m[t])[0] = 2 \frac{1}{2} CD[m, f][0] = CD[m, f][0],$$

i.e. in the both cases $$(K_m[t]*\Theta[t])[0]=CD[m, f][0].$$

Thus, $$\int_{-\infty}^{\infty} K_m[u] \Theta[u] du = (-1)^m \int_{-\infty}^{\infty} K_m[0 - u] \Theta[u] du$$

$$= (-1)^m (K_m[t] * \Theta[t])[0]$$

$$= (-1)^m CD[m, f][0]$$

for all m.

Consequently, $$\int_{-\infty}^{\infty} K_m[u] \Theta[u] du = \int_{-\infty}^{\infty} f[u] K_m[u] du$$

$$= (-1)^m CD[m, f][0].$$

$$\int_{-\infty}^{\infty} K_m[u]\Theta[u]du = \int_{-\infty}^{\infty} f[u]du = (-1)^m CD[m, f][0]$$

These facts can be now used for improving evaluations of chromatic derivatives using either the oversampled data or the analog format of the signal.

First, the factor $$\sqrt{1 - J_0[t]^2 - 2 \sum_{i=1}^{N} J_i[t]^2}$$

in the truncation error $$\left| f[t] - f[t_0] J_0(t - t_0) + 2 \sum_{k=1}^{N} CD[k, f, t_0] J_k(t - t_0) \right|$$

is very steep, yet bounded by $$\sqrt{2 \sum_{i=N}^{\infty} J_i[t]^2} < \sqrt{J_0[t]^2 + 2 \sum_{i=1}^{\infty} J_i[t]^2} = 1.$$

Thus the associated the window $$W[t] = \frac{a+1}{a^2} \left( \sqrt{1 - J_0[\pi t]^2 - 2 \sum_{k=1}^{N} J_k[\pi t]^2} + \frac{1}{a} \right)^{-1} - \frac{1}{a+1}$$

is very steep. We choose the approximation interval based on the function W[t]. For given degree of approximation N we denote by −M the largest sampling point such that the window W[t] is monotone in the interval [−M, 0]. Let $$\psi[t] = X[0]J_0[t] + 2\sum_{k=1}^{N} X[k]J_k[t].$$

Then we consider the sum:

$$S = u\int_{-M}^{M} (W[u](\psi[u] - f[u]))^2 du +$$

$$v\sum_{m=0}^{N} \int_{-M}^{M} (K_m[u]W[u](\psi[u] - f[u]))^2 du + w\sum_{m=0}^{N} X[m]^2$$

Here $$\int_{-M}^{M} (W[u](\psi[u] - f[u]))^2 du$$

replaces the discrete least squares fit; the part $$\sum_{m=0}^{N} \int_{-M}^{M} (K_m[u]W[u](\psi[u] - f[u]))^2 du$$

is designed to reduce an "aliasing" phenomenon, and is the "finite simulation" of the fact that $$\int_{-\infty}^{\infty} K_m[u]\Theta[u]\,du = \int_{-\infty}^{\infty} f[u]K_m[u]\,du$$
$$= (-1)^m CD[m, f][0].$$

Thus, this part restricts possibility of one Bessel function being "replaced" by a linear combination of others, with small error within the FINT interval [−M,M].

One now proceeds with the standard quadratic minimization techniques which consist in differentiation with respect to the variables X[i], setting these derivatives all equal to zero, and solving the corresponding system of linear equations, exactly as above.

Type 2: Sinc function as interpolation function

One can use the standard base used in the Nyquist interpolation formula consisting of several integer shifts of the Sinc[t] function to replace Bessel functions in this first stage of data acquisition unit. One first approximates locally the Bessel function $J_m[\pi t]$ using Nyquist interpolation formula with, say 17 shifts of $\mathrm{Sin}[\pi t]/(\pi t)$:

$$J_m[\pi t] \approx \sum_{j=-8}^{8} \frac{\mathrm{Sin}[\pi(t-j)]}{\pi(t-j)} A[j, m].$$

Notice that we are not using for A[j,m] the values $J_m[\pi j]$, but choose them so that the interpolation formulas provides the best local approximation. This is accomplished by choosing A[j,m] so that $$H[t] = \sum_{j=-8}^{8} \frac{\mathrm{Sin}[\pi(t-j)]}{\pi(t-j)} A[j, m]$$

has Chebyshev type Chromatic derivatives at 0 equal to the values of the Chromatic derivatives of the corresponding Bessel function $J_k[\pi t]$. Thus, A[j,m] is chosen so that $$\sum_{j=-8}^{8} A[j, m]CD\left[k, \frac{\mathrm{Sin}[\pi(t-j)]}{\pi(t-j)}\right] = (-1)^k \frac{1}{2}(J_{k+m}[0] + (-1)^{\mathrm{Min}[k,m]} J_{|k-m|}[0]).$$

The values $$CD\left[k, \frac{\mathrm{Sin}[\pi(t-j)]}{\pi(t-j)}\right]$$

must be computed (e.g., with Mathematica software) using limits and with high precision due to the tendency to error accumulation of evaluations of higher order derivatives of $$\frac{\mathrm{Sin}[\pi(t-j)]}{\pi(t-j)}.$$

For example, Bessel function $J_0[\pi t]$ can be approximated by $$J_0[\pi t] \approx \sum_{j=-8}^{8} \frac{\mathrm{Sin}[\pi(t-j)]}{\pi(t-j)} A[j, 0]$$

with the following values of A[j,0], −8 ≤ j ≤ 8:

A[−8, 0] = 7.0499449940993569

A[−7, 0] = 9.1083068045593241

A[−6, 0] = 4.2205228655115949

A[−5, 0] = 0.5490843317607693

A[−4, 0] = 0.1968047186334627

A[−3, 0] = 0.1806903578086363

A[−2, 0] = 0.2202775461799985

A[−1, 0] = −0.3042421776406465

A[0, 0] = 1.0000000000000000

A[1, 0] = −0.30424217764064650

A[2, 0] = 0.22027754617999856

A[3, 0] = 0.18069035780863606

A[4, 0] = 0.19680471863346274

A[5, 0] = 0.54908433176076931

A[6, 0] = 4.22052286551159488

A[7, 0] = 9.10830680455932409

A[8, 0] = 7.04994499409935698

Thus, instead of using Bessel functions themselves, one uses their approximations of the form $$J_m[\pi t] \approx B[m, t] = \sum_{j=-8}^{8} \frac{\mathrm{Sin}[\pi(t-j)]}{\pi(t-j)} A[j, m]$$

with the values for A[j,m] determined as described above. One now constructs the sum with unknown parameters C[m], 0 ≤ m ≤ k and weights u,v $$S = u \sum_{i=-M}^{M} W\left[\frac{i}{8}\right]^2 \left(-f\left[\frac{i}{8}\right] + B\left[0, \frac{i}{8}\right]C[0] + 2\sum_{j=1}^{k} B\left[j, \frac{i}{8}\right]C[j]\right)^2 +$$

$$v \sum_{j=-8}^{8} \left(\sum_{m=0}^{k} B[m, j]C[m]\right)^2$$

which plays the same role as in the previous case:

$$B\left[0, \frac{i}{8}\right]C[0] + 2\sum_{j=1}^{k} B\left[j, \frac{i}{8}\right]C[j]$$

is the value of the interpolation at an over sampling point $$\frac{i}{8};$$

$$\sum_{i=-M}^{M} W\left[\frac{i}{8}\right]^2 \left(-f[i] + B\left[0, \frac{i}{8}\right]C[0] + 2\sum_{j=1}^{k} B\left[j, \frac{i}{8}\right]C[j]\right)^2$$

is the weighted (windowed) sum of squares of differences between the interpolated values $$B\left[0, \frac{i}{8}\right]C[0] + 2\sum_{j=1}^{k} B\left[j, \frac{i}{8}\right]C[j]$$

and the sampled values $$f\left[\frac{i}{8}\right].$$

However, the term which ensures the stability of the least square fit $$v \sum_{j=-8}^{8} \left(\sum_{m=0}^{k} B[m, j]C[m]\right)^2$$

is significantly different. Instead of limiting the sum of squares of the Bessel-type chromatic derivatives one now limits the energy of the approximation, which is, in this case, finite. Note that $$\sum_{m=0}^{k} B[m, j]C[m]$$

represents the value of the interpolation at a point j, and thus $$\sum_{j=-8}^{8} \left(\sum_{m=0}^{k} B[m, j]C[m]\right)^2$$

is the energy of approxmation (all non zero sampled values are between −8 and 8 by construction). Thus, if the average energy of the noise is known, it is easy to choose the parameters u,v in a way that ensures optimal performance and stability of the algorithm. Also, u,v can be changed dynamically, in order to obtain an adaptive algorithm. Again, we can replace the summation over oversampled points with an integration over the same time interval, allowing for analog or mixed signal processing, as above.

Also, using the shifts of the Sinc[t] function provides filtering of different type than the filtering provided by the Bessel functions which are used in the subsequent processing, thus adding the noise robustness.

Clearly the above procedure immediately generalizes to any family of fundamental functions associated with a regular family of orthogonal polynomials: the Bessel functions are just one example.

Zero delay Zero Phase-shift Filter-differentiators and Predictors

The same technique applied to least square fits to obtain filters without delay or phase-shifts apply here as well. We minimize $$S = u \int_{-M}^{L} (W[u](\psi[u] - f[u]))^2 \, du +$$

$$v \sum_{m=0}^{N} \int_{-M}^{L} (K_m[u]W[u](\psi[u] - f[u]))^2 \, du +$$

$$w \sum_{m=0}^{N} X[m]^2$$

for L<M, such that pont L represents the ends of the available data stream.

(II) Approximations by a Complex:

In order to avoid excessive aliasing which large degree expansions would inevitably produce and still be able to extend the interval of approximation, we employ a construction vaguely resembling (in the idea) polynomial splines. A complex is a a sequence of basic approximations of any kind as described above, parametrized (simultaneously) by a set of sequences of variables, one sequence for each basic approximation as employed above. To the usual conditions associated with every basic approximation one adds conditions ensuring that the adjacent basic approximations "agree" about the values of the Chromatic derivatives evaluated at the same point. This technique has been applied to polynomial approximations as described in the disclosure "Signal Processing With Local Signal Behavior". We first explain this on the example of a complex with Bessel functions as interpolants. Using properties of the Chebyshev-type chromatic derivatives one can introduce the following approximations for the $a^{th}$ derivative of a band-limited function, associated with each basic approximation of a 3-complex, i.e. a complex involving three basic approximations, and a slightly modified windowing function WN[m, t].

$$AP1[a, s] = X_1[a]J_0\left[\pi\left(\frac{s}{z}\right)\right] +$$

$$\sum_{i=1}^{N-a} (X_1[a+i] + (-1)^{Min[i,a]} X_1[|a-i|])J_i\left[\pi\left(\frac{s}{2}\right)\right],$$

$$AP2[a, s] = X_2[a]J_0\left[\pi\left(\frac{s}{z}\right)\right] +$$

$$\sum_{i=1}^{N-a} (X_2[a+i] + (-1)^{Min[i,a]} X_2[|a-i|])J_i\left[\pi\left(\frac{s}{2}\right)\right],$$

$$AP3[a, s] = X_3[a]J_0\left[\pi\left(\frac{s}{z}\right)\right] +$$

$$\sum_{i=1}^{N-a} (X_3[a+i] + (-1)^{Min[i,a]} X_3[|a-i|])J_i\left[\pi\left(\frac{s}{2}\right)\right],$$

-continued $$WN[m, t] = \frac{a+1}{a^2}\left(\sqrt{1 - J_0[\pi t]^2 - 2\sum_{k=1}^{N-m} J_k[\pi t]^2} + \frac{1}{a}\right)^{-1} - \frac{1}{a+1}$$

Thus, the parameter m in WN[m, t] reduces the degree of approximation. This is necessary because it can be shown that, if the signal is interpolated using Bessel functions $J_0 J_1, \ldots, J_N$ then its $m^{th}$ derivative, interpolated by AP[m, t] is essentially an interpolation of order N-m.

Subsequently, one defines the following three sums, each corresponding to the appropriate basic approximation, with z equal to the oversampling factor.

The interval [-M, M] is chosen on the basis of the corresponding window WN[0, t] as the smallest integer point larger than the first point ρ at which the first derivative of the function WN[0, t] is equal to 0 and thus where WN[0,t] is no longer decreasing in a monotone way for 0<t<ρ.

$$S1 = \sum_{i=-zM}^{zM} WN\left[0, \frac{i}{z}\right]^2 \left(-f\left[\frac{i}{z}\right] + J_0\left[\pi\frac{i}{z}\right]X_1[0] + 2\sum_{j=1}^{N} J_j\left[\pi\frac{i}{z}\right]X_1[j]\right)^2,$$

$$S2 = \sum_{i=-zM}^{zM} WN\left[0, \frac{i}{z}\right]^2 \left(-f\left[\frac{i}{z} - 1\right] + J_0\left[\pi\frac{i}{z}\right]X_2[0] + 2\sum_{j=1}^{N} J_j\left[\pi\frac{i}{z}\right]X_2[j]\right)^2,$$

$$S3 = \sum_{i=-zM}^{zM} WN\left[0, \frac{i}{z}\right]^2 \left(-f\left[\frac{i}{z} - 2\right] + J_0\left[\pi\frac{i}{z}\right]X_3[0] + 2\sum_{j=1}^{N} J_j\left[\pi\frac{i}{z}\right]X_3[j]\right)^2,$$

Notice that these approximations are centered at 0,-1,-2. This explains the shifted z-times oversampled values $$f\left[\frac{i}{z}\right], f\left[\frac{i}{z} - 1\right], f\left[\frac{i}{z} - 2\right]$$

of the signal f. The sums E1,E2,E3 play the usual role as in the simple approximations:

$$E1 = \sum_{s=1}^{N} X_1[s]^2,$$

$$E2 = \sum_{s=1}^{N} X_2[s]^2,$$

$$E3 = \sum_{s=1}^{N} X_3[s]^2,$$

Finally, D1 and D2 correspond to an approximation of the RMS value of the sum of differences of chromatic derivatives calculated using each of the three interpolations. Thus, D1 and D2 will ensure that (if multiplied with a large weight w) the three basic approximations "agree" about the values of the chromatic derivatives within the enror given by the appropriate windowing function WN[k,t].

$D1 =$ $$\sum_{a=1}^{8}\sum_{k=1}^{N} w_1[k]WN\left[k, \frac{a}{8}\right]WN\left[k, 1 - \frac{a}{8}\right]\left(AP1\left[k, -\frac{a}{8}\right] - AP2\left[k, 1 - \frac{a}{8}\right]\right)^2,$$

$D2 =$

-continued $$\sum_{a=1}^{8}\sum_{k=1}^{N} w_2[k]WN\left[k, \frac{a}{8}\right]WN\left[k, 1 - \frac{a}{8}\right]\left(AP2\left[k, -\frac{a}{8}\right] - AP3\left[k, 1 - \frac{a}{8}\right]\right)^2,$$

The weighted sum S=u(S1+S2+S3)+v(E1+E2+E3)+w (D1+D2) is now minimized using the standard procedure. Again, oversampling can be replaced by integration.

Similar procedure can be applied to produce a complex in which Bessel functions are replaced by their Nyquist type approximations as in the basic case described above, or with any other class of basis functions.

Figure 4:
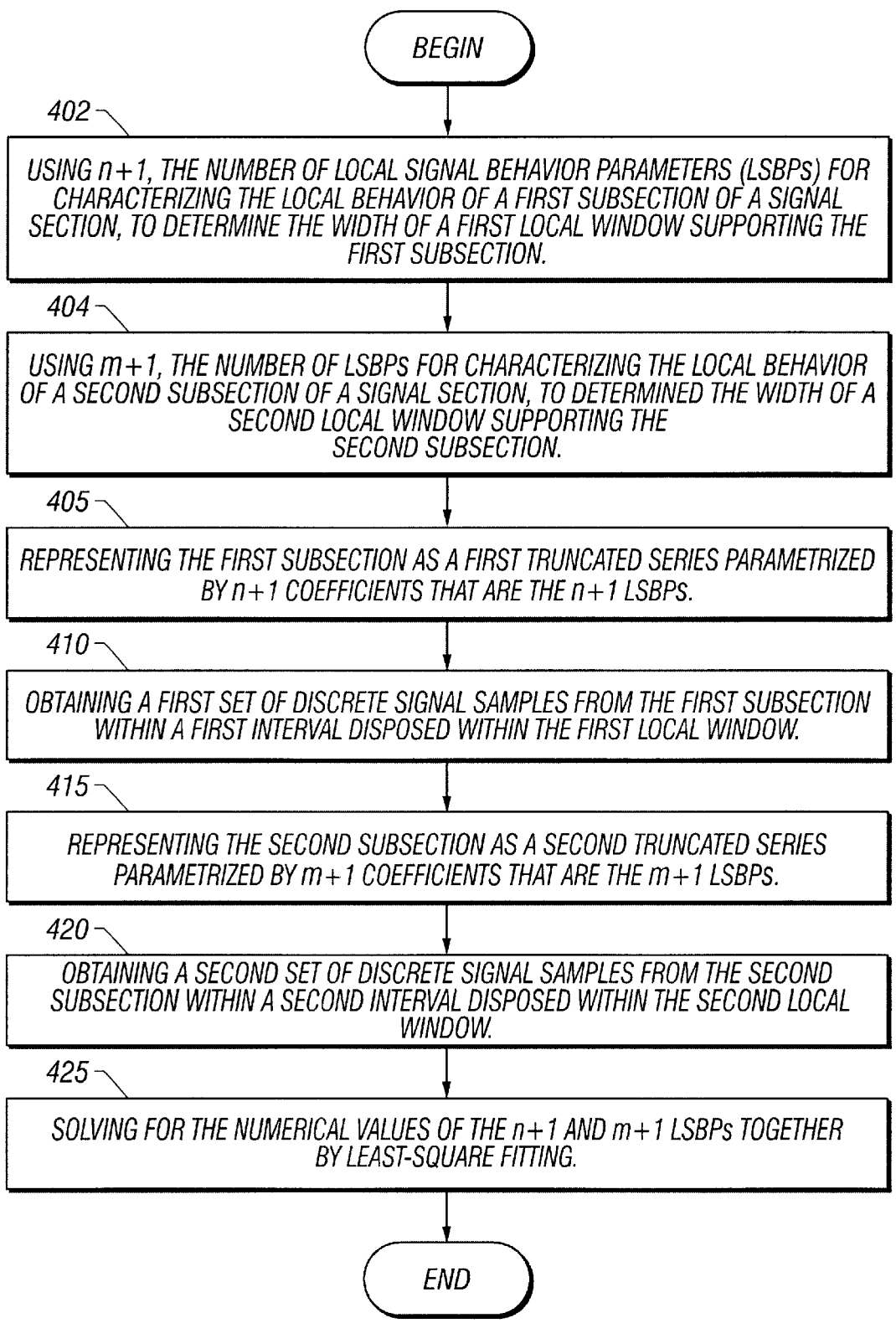
FIG. 4 is a flow chart outlining steps for coding a signal section within two overlapping sampling windows in accordance with one embodiment of the invention.

Referring now to FIG. 4, a flow chart 400 is shown outlining steps for digitizing a section of a BL analog signal in accordance with one embodiment of the invention. Specifically, within a sampling window constituted by a first and a second windows having an overlap, the section has a fist subsection in the first local window and a second subsection in the second local window. Moreover, flow chart 400 demonstrates a way to implement the introduced mathematical concepts in accordance with the present embodiment. As understood heren, steps outlined in flow chart 400 are not limited to the case of a sampling window having two overlapping constituent windows. In another embodinent, steps in flow chart 400 is applied to a case of a sampling window having more than two overlapping constituent windows.

In step 402, n+1, the number of LSBPs for characterizing the local behavior of the first subsection, is used to determine the width of the first local window. Also, m+1, the number of LSBPs for characterzing the local behavior of the second subsection, is used to determine the width of the second local window.

In step 405, the first subsection is represented as a first truncated series at a first sampling moment in the first local window. The first truncated series is parametrized by n+1 coefficients that are n+1 LSBPs adapted for characterizing the local signal behavior of the first subsection between Nyquist points. The first truncated series is forned by n+1 basis functions, with the n+1 LSBPs as coefficients respectively for the n+1 basis functions. The n+1 LSBPs are values of n+1 chromatic differential operators of order 0 to order n evaluated at the first sampling moment. These n+1 chromatic differential operators of order 0 to order n are associated respectively with regular polynomials of order 0 to order n. These regular polynomials feasibly separate points. In one embodiment, these regular polynomials are Chebyshev polynomials. In another embodiment, these regular polynomials are Legendre polynomials In step 410, a first set of discrete signal samples is obtained by over-sampling the first subsection within a first interval disposed within the first local window. Optionally, the first interval can be as large as the first local window. Moreover, the basis functions are fundamental functions of order 0 to order n. In one embodinent, the fundamental functions are Bessel functions. In yet another embodoment, the fundamental functions are Sinc functions.

In step 415, the second subsection is represented as a second truncated series at a second sampling moment in the second local window. The second truncated series is parametrized by m+1 coefficients that are m+1 LSBPs adapted for characterizing the local signal behavior of the subsection between Nyquist points. The first truncated series is formed by m+1 basis functions, with the m+1 LSBPs as coefficients respectively for the m+1 basis functions. Moreover, the basis functions are fundamental functions of order 0 to order m. In one embodiment, the fundamental functions are Bessel functions. In another embodiment, the fundamental functions are chromatic derivatives of Sinc function The m+1 LSBPs are values of m+1 chromatic differential operators of order 0 to order m evaluated at the second sampling moment. These m+1 chromatic differential operators of order 0 to order m are associated respectively with regular polynomials of order 0 to order m. These regular polynomials separate points. In one embodiment, these regular polynomials are Chebyshev polynomials. In another embodonent, these regular polynomials are Legendre polynomials.

In step 420, a second set of discrete signal samples is obtained by over-sampling the second subsection within a second interval disposed within the second local window. Optionally, the second interval can be as large as the second local window.

In step 425, numerical values of said n+1 and m+1 LSBPs are solved together such that the numerical values of the n+1+m+1 LSBPs provide curve fitting for the first truncated series with the first plurality of discrete samples, and for the second truncated series with the second plurality of discrete signal samples. In one embodiment, the curve fitting used is least-square fitting. In another embodiment, numerical values of the n+1 and m+1 LSBPs are solved using approximation techniques other than least-square fitting.

The 3-complex was presented here merely for ease of explication: any number of basic approximations can be used. In general, of course, the basic approximations need not all be of the same order. They need not be evenly spaced, and they need not be symmetric. The domain of each application of the window function WN[k,t] may also be varied, as may the window function itself. The number of derivatives for which "agreement" is ensured may be varied, and "agreement" may be ensured also for non-adjacent basic approximations. The particulars presented above are simply the most easily read.

(III) Zero delay zero phase-shift filter differentiators and predictors: In another embodiment, the above procedure can be applied to obtain a basic method for predictions, by using a 5-complex (a complex with 5 basic interpolations) for which the parts S1–S5 do not have oversampled data for the entire windows. This also provides a basic zero delay zero phase-shift filter, applicable in low-noise environments providing good approximations for the one-sided (left-sided) first and second order chromatic derivatives at the very end of the data stream. As understood herein, the above procedure need not be restricted to a 5-complex. In an alternative embodiment, a complex with more than 5 interpolations is used.

(II) Chromatic Signal Processing Procedures

Chromatic Signal Processing Procedures can be classified as:

(i) Signal Transformation Procedures;

(ii) Error Minimization Procedures; and (iii) Data Extraction Procedures.

Signal Transformation Procedures act on signals locally represented by Chromatic Derivatives by a linear operator L (e.g. a filtering operator) and providing a representation of the output in the same format.

Error Minimization Procedures prevent error accumulation and are of auxiliary nature.

Data Extraction Procedures output certain features of the signal which go beyond its mere local representation, but do not change the signal itself.

(i) Signal Transformation Procedures

Applying an arbitarary linear operator to a signal

Let $$f[t+t_0] = f[t_0]B_0[t] + 2\sum_{s=1}^{\infty} \Delta[s, f, t_0]B_s[t].$$

Here function $B_0$ is the basic function of order 0 which corresponds to a family of regular polynomials $\Pi$, and $\Delta[s, f, t_0]$ is the $s^{th}$ chromatic derivative of f with respect to the differential operators corresponding to the family of regular polynomials $\Pi$. For example, if $\Pi$ is the family of Chebyshev polynomials, then $\Delta[s, f, t_0]$ are Chromatic derivatives defined recursively as described above, i.e.

$$CD_{Chebyshev}[0, f] = f;$$

$$CD_{Chebyshev}[1, f] = \frac{1}{\pi}(\partial CD_{Chebyshev}[0, f]/\partial t);$$

$$CD[k, f] = \frac{2}{\pi}(\partial CD_{Chebyshev}[k-1, f]/\partial t) + CD_{Chebyshev}[k-2, f]$$

Then for an arbitrary continuous, bounded, shift invariant, linear operator L, $$(L[f])[t] = f[t_0](L[B_0])[t-t_0] + 2\sum_{s=1}^{\infty} \Delta[s, f, t_0](L[B_s])[t-t_0].$$

However, the values $\Lambda_s[t]=(L[B_s])[t]$ are independent of f and can be calculated in advance, and their local representation obtained in the form $$\Lambda_s[t] = \Lambda_s[0]B_0[t] + 2\sum_{s=1}^{\infty} \Delta[s, \Lambda_s, 0]B_s[t].$$

All the linear operators of any practical interest have the property that $\|L(f)\|<k\|f\|$ for a relatively small k. Thus, truncation of the above formula up to M+1$^{th}$ term gives:

$$\Lambda_s[t] = \Lambda_s[0]B_0[t] + 2\sum_{s=1}^{M} \Delta[s, \Lambda_s, 0]B_s[t].$$

with a small truncation error. Thus, if the signal is represented by $$f[t+t_0] = f[t_0]B_0[t] + 2\sum_{s=1}^{M} \Delta[s, f, t_0]B_s[t].$$

The output can be represented by $$(L[f])[t] = (L[f])[t_0]B_0[t-t_0] + 2\sum_{s=1}^{M} \Delta[s, L[f], t_0]B_s[t-t_0]$$

where the values of $(L[f])[t_0]$ and $\Delta[s,L[f], t_0]$ are obtained by substituting $$(L[B_s])[t-t_0] = \Lambda_s[t-t_0] = \Lambda_s[0]B_0[t-t_0] +$$

-continued $$2\sum_{s=1}^{M} \Delta[s, \Lambda_s, 0]B_s[t-t_0]$$

into $$(L[f])[t] = f[t_0](L[B_0])[t-t_0] + 2\sum_{s=1}^{M} \Delta[s, f, t_0](L[B_s])[t-t_0].$$

This implies that the new values $\Delta[s, L[f], t_0]$ can be obtained by a simple matrix multiplication, multiplying vector $(\Delta[s, f, t_0])_{s \leq M+1}$ by a square matrix M×M corresponding to the substitution mentioned above.

Figure 5:
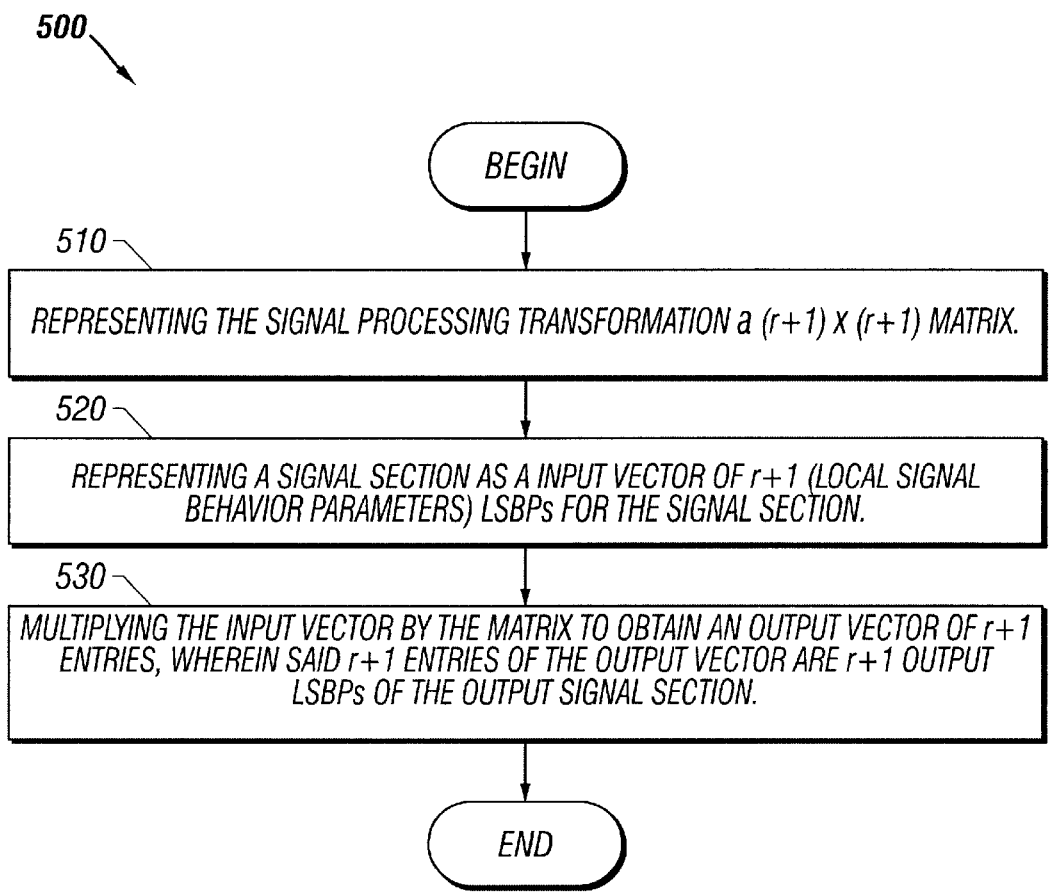
FIG. 5 is a flow chart outlining steps for performing signal processing transformation in accordance with one embodiment of the invention.

Referring now to FIG. 5, a flow chart 500 is shown outlining steps for signal transformation performed on an input signal in accordance with one embodiment of the invention. In particular, flow chart 500 demonstrates a way to implement the introduced mathematical concepts in accordance with the present embodiment.

In step 510, the signal processing transformation represented as a r+1 by r+1 matrix.

In step 520, the input signal section is represented as a vector of said r+1 LSBPs.

In step 530, the vector is multiplied by the matrix to obtain an output vector of r+1 entries, wherein said r+1 entries of the output vector are r+1 output LSBPs of the output signal section. This output signal section is represented as a truncated series parametrized by said r+1 output LSBPs, and wherein these output LSBPs characterize behavior of the output signal section between Nyquist rate points. As understood here, the matrix need not restricted to a square matrix. For example, in another embodiment, a matrix of r+1 by q, where q<r+1.

(II) Error Minimization Procedures
Uniformization

The aim of the data uniformization procedre is to prevent error accumulation.

$$SU = v\sum_{k=0}^{N} (CD[k, 0] - X[k])^2 +$$

$$\sum_{z=-R}^{R} \sum_{k=0}^{N-P} \int_{-M-z}^{M+z} W[t]W[t-z]\bigg((X[k]J_0[\pi\,t] +$$

$$\sum_{i=1}^{N-k} (X[k+i] + (-1)^{Min[k,i]}X[[k-i]])J_i[\pi\,t]\bigg) -$$

$$\bigg(CD[k, z]J_0[\pi(t-z)] + \sum_{i=1}^{N-k} (CD[k+i, z] +$$

$$(-1)^{Min[k,i]}CD[[k-i], z])J_i[\pi(t-z)]\bigg)\bigg)^2 dt$$

Thus, minimization of SU results in an approximation which minimizes the RMS value of the difference between the new approximation defined by the values X[k] of the chromatic derivatives off [t] and the old values CD[k,z], for 2R+1 consecutive Nyqist rate spaced points $-R, \ldots, 0, \ldots, R$. Thus, P highest order derivatives are treated as auxiliary data whose role is only to provide a good interpolation of the derivatives of order up to N−P. Expansion of the derivative N−P replaces then the oversampled values of this derivative in an interval depending on the value of P, essentially in the window given by $$W[t] = \frac{a+1}{a^2}\bigg(\sqrt{1 - J_0[\pi\,t]^2 - 2\sum_{k=1}^{P} J_k[\pi\,t]^2} + \frac{1}{a}\bigg)^{-1} - \frac{1}{a+1}.$$

One can perform several layers of uniformization, each extending the inteval from which the data is used and thus reducing the error due to the out of band noise, the round-off, and intrinsic errors of approximations used.

Figure 6:
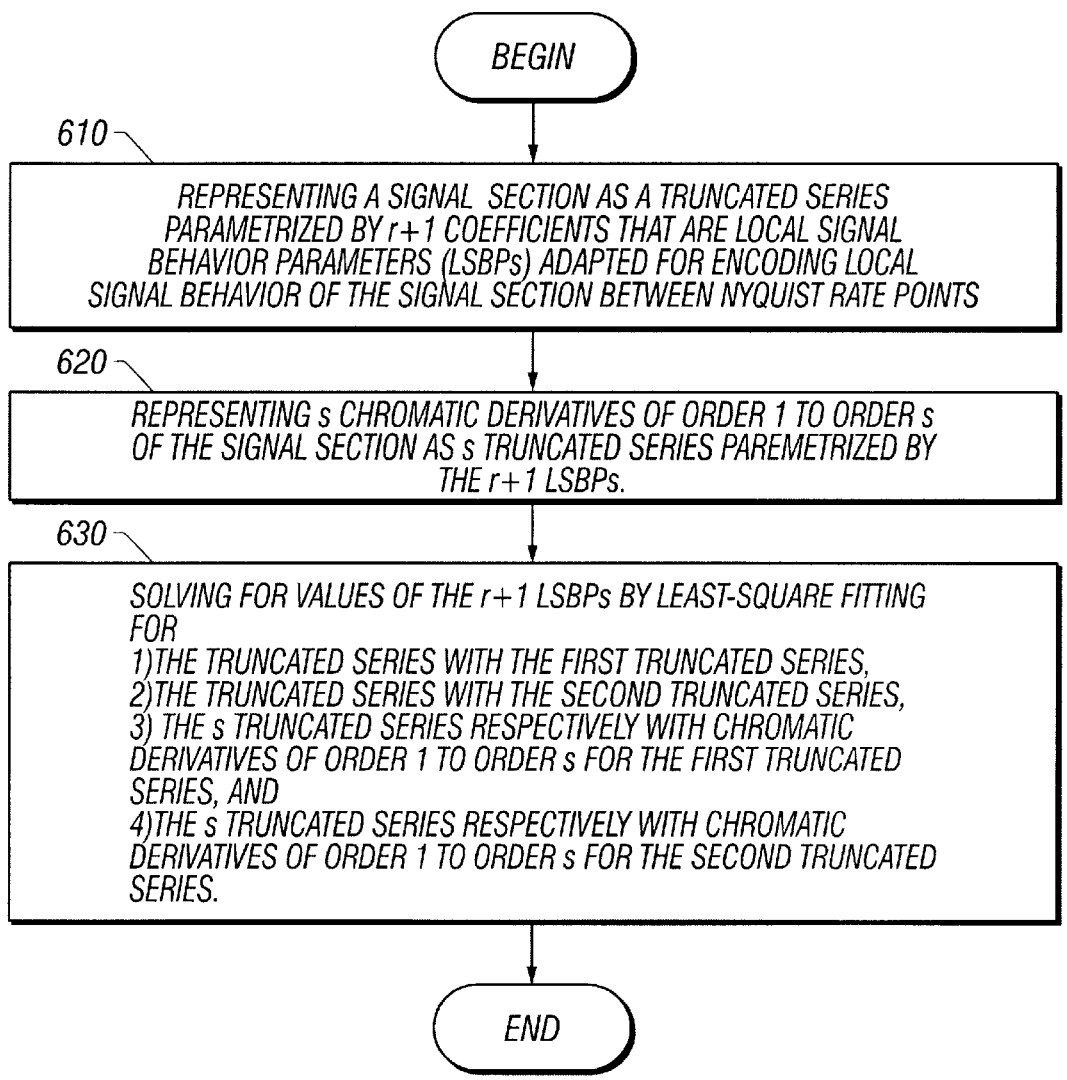
FIG. 6 is a flow chart outlining steps for coding a signal section from local signal behavior parameters of two over-lappiig subsections that constitute the signal section in accordanc with one embodiment of the invention.

Referring now to FIG. 6, a flow chart 600 is shown outlining (according to one embodiment) steps for forming a signal representation of a signal section from LSBPs of two or more signal subsections that are making up the signal section. Specifically, multiple subsection's LSBPs are used together to generate the section's LSBPs. Moreover, flow chart 600 demonstrates a way to implement the introduced mathematical concepts in accordance with the present embodiment.

In step 610, the section as a truncated series at a sampling moment in a sampling window supporting the section. The truncated series is parametrized by r+1 coefficients that are LSBPs adapted for encoding local signal behavior of the section between Nyquist rate points.

In step 620, s chromatic derivatives of order 1 to order s of said section are represented as s truncated series parametrized by said r+1 LSBPs.

In step 630, values of said r+1 LSBPs are solved to provide curve fitting for 1) said truncated series with said first truncated series, 2) said truncated series with the second truncated series, and 3) said s truncated series respectively with chromatic derivatives of order 1 to order s for the first truncated series, and 4) the s truncated series respectively with chromatic derivatives of order 1 to order s for the second truncated series. In one embodiment, The curve fitting implemented is least-square fitting.

(III) Data Extraction Procedures
1. Evaluation of High Order Derivatives

Higher order derivatives are evaluated from the values of the lower order derivatives as follows. Assume that the second layer processing has produced highly accurate values of N−P chromatic derivatives of f[t]. The derivative of order N−P is now treated as a new band-limited signal, represented NOT by its oversampled values but by an expansion of order P. Now any of the first layer techniques are applicable, except that the oversampled values of the chromatic derivative of order N−P are replaced by the expansion of order P. The new N chromatic derivatives are now, if necessary, subjected to the second layer processing, i.e., uniformization, producing N−P chromatic derivatives of CD[N−P, f, $t_0$]. Finally, one uses formulas for the composition of chromatic derivatives to obtain:

$CD[m, CD[N-P, f]]=\frac{1}{2}(CD[N-P+m, f]+(-1)^m CD[N-P-m, f])$ i.e., $(CD[N-P+m, f]=2CD[m, CD[N-P, f]]-(-1)^m CD[N-P-m, f])$.

for all $m \leq N-P$ to evaluate the chromatic derivatives of the input signal CD[N−P+m, f] for all m such that $m \leq N-P$. Repeating the procedure k times results in the values of k(N−P) derivatives. This allows evaluation of derivatives of very high order, by using data from intervals whose length increases appropriately.

This also explains the stability of our methods for evaluating high order derivatives. Limit procedures at a single point are replaced by procedures requiring data from longer intervals, bridging the gap between local and global signal behavior means. This integration of the local and global signal behaviour paradigms is exemplified in the procedures which approximate the spectrum of the signal fusing chromatic differentiation and the "global" signal behavior as explained below.

Figure 7:
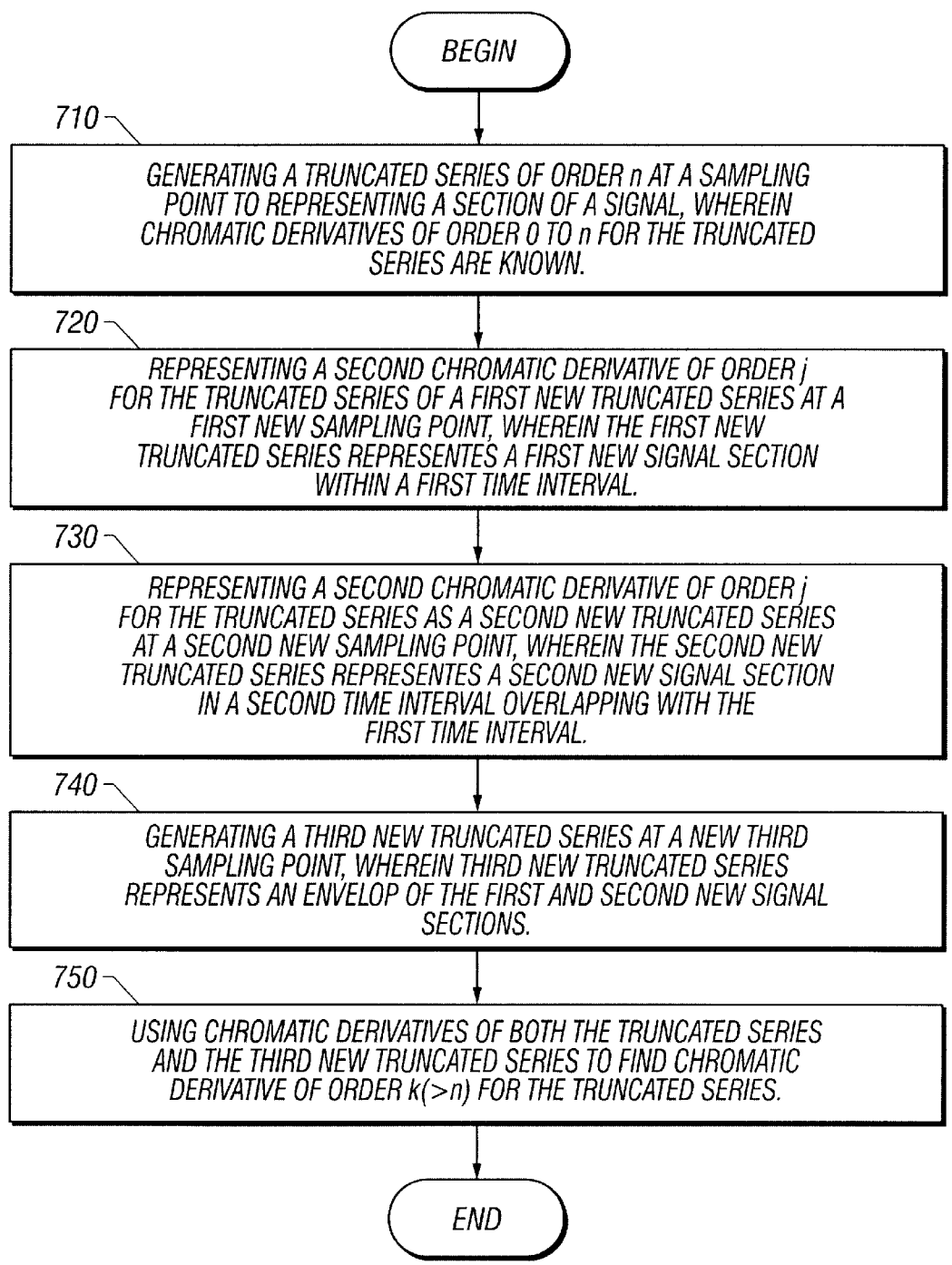
FIG. 7 is a flow chart outlining steps for obtaining a chromatic derivative from lower order chromatic derivatives in accordance with one embodiment of the invention.

Referring now to FIG. 7, a flow chart 700 is shown outlining steps of evaluating a signal's order k chromatic derivative from the signal's lower order chromatic derivatives in accordance with one embodiment of the invention. In particular, flow chart 700 demonstrates a way to implement the induced mathematical concepts in accordance with the present embodiment.

In step 710, chromatic derivative of order j for the truncated series is represented as a new truncated series of order h parametrized by h coefficients that are h LSBPs of said new truncated series, where j+h>k>r, wherein said curve fitting is least-square fitting.

In step 720, the h LSBPs are solved such that they provide curve fitting of the chromatic derivative of order j with the new truncated series.

In step 730, the h LSBPs are used to express said chromatic derivative of order k.

2. Chromatic Derivatives and the Spectrum

Assume that f[t] is a $\pi$-bandlimited signal of finite energy whose Fourier transform is $H_f[\omega]$, i.e., $$f[t] = \frac{1}{2\pi} \int_{-\pi}^{\pi} H_f[\omega] e^{i\omega t} d\omega$$

Then $H_f[\omega]$ is a continuous complex function and its real part is an even function while its imaginary part is an odd function. Both parts are continuous real functions and they can be approximated with any set of orthogonal polynomials. We recall that all band-limited real functions f have a Fourier transform with even real and odd imaginary part, as well as that all even degree Chebyshev polynomials are even functions (containng only even powers of the variable) and all odd degree Chebyshev polynomials are odd functions. Thus, by expanding both the real and the imaginary part of $H_f[\omega]$ into a series of Chebyshev polynomials, taking into account the above fact, for an infinite sequence of real numbers A[j] we get:

$$f[t] = \frac{1}{2\pi} \int_{-\pi}^{\pi} H_f[\omega] e^{i\omega t} d\omega$$

$$= \frac{1}{2\pi} \int_{-\pi}^{\pi} \sum_{k=0}^{\infty} A[k] i^k T_k\left[\frac{\omega}{\pi}\right] e^{i\omega t} d\omega$$

Since the convergence of polynomial approximations over a finite closed interval is uniform, we can exchange the order of integration and summation to get:

$$f[t] = \frac{1}{2\pi} \int_{-\pi}^{\pi} \sum_{k=0}^{\infty} A[k] i^k T_k\left[\frac{\omega}{\pi}\right] e^{i\omega t} d\omega$$

$$= \sum_{k=0}^{\infty} A[k] \frac{1}{2\pi} \int_{-\pi}^{\pi} i^k T_k\left[\frac{\omega}{\pi}\right] e^{i\omega t} d\omega$$

$$= \frac{1}{2\pi} \sum_{k=0}^{\infty} A[k] CD[k, \text{Sinc}[t]]$$

$$= \sum_{k=0}^{\infty} A[k] K_m[t]$$

This provides a GLOBAL representation of the function $$f[t] = \frac{1}{2\pi} \int_{-\pi}^{\pi} H_f[\omega] e^{i\omega t} d\omega,$$

because the series $$\sum_{k=0}^{\infty} A[k] K_m[t]$$

is uniformly convergent unlike the representation which uses Bessel functions and chromatic derivatives, i.e.

$$f[t] = CD[0, f][0] J_0[t] + 2 \sum_{k=1}^{\infty} CD[k, f][0] J_k[t]$$

which provides highly local, non-uniformly converging approximation.

For practical purposes of signal processing, the expansion $$f[t] = \frac{1}{2\pi} \int_{-\pi}^{\pi} \sum_{k=0}^{\infty} A[k] i^k T_k\left[\frac{\omega}{\pi}\right] e^{i\omega t} d\omega$$

$$= \sum_{k=0}^{\infty} A[k] K_k[t]$$

is truncated and the coefficients A[k] are replaced by y[k] such that A[k] =2$\pi$y[k]. Then, $$H_f[\omega] \approx \sum_{k=0}^{C} 2\pi\gamma[k] i^k T_k\left[\frac{\omega}{\pi}\right] \text{ and } f_C[t] = \sum_{k=0}^{C} \gamma[k] K_k[t]$$

This implies that an approximation of the spectrum of the signal by Chebyshev polynomials of the form $$\sum_{k=0}^{C} 2\pi\gamma[k] i^k T_k\left[\frac{\omega}{\pi}\right] \approx H_f[\omega]$$

produces an approximation of the signal in the time domain which is a linear combination of the functions $K_k[t]$ with the SAME coefficients y[k]. Thus, these coefficients provide BOTH an approximation of the spectrum of the function (frequency domain) AND a uniform approximation of the function (in the time domain).

One possible method for obtaining coefficients y[k] is by using a least square fit in several ways. First, we note that $$f_C[t] = \sum_{j=0}^{C} \gamma[j] K_j[t] = \sum_{j=0}^{C} \gamma[j] CD[j, \text{Sinc}[t]]$$

implies that $$CD[k, f_C[t]] = \sum_{j=0}^{C} \gamma[j] CD[k, CD[j, \text{Sinc}[t]]]$$

$$= \sum_{j=0}^{C} \frac{\gamma[j]}{2} (CD[k+j, \text{Sinc}[t]] +$$

-continued
$$(-1)^{Min[k,j]}CD[|k-j|, \text{Sinc}[t]])$$
$$= \sum_{j=0}^{C} \frac{\gamma[j]}{2}(K_{k+j}[t] + (-1)^{Min[k,j]}K_{|k-j|}[t])$$

The correctness of expansion follows from the fact that $\{K_m[t]:m\in N\}$ is an orthogonal system in the space of all $\pi$ band limited square integrable functions (signals of of finite energy) with the scalar product defined by $$\langle\langle f,g\rangle\rangle = \frac{1}{2\pi}\int_{-\pi}^{\pi}\frac{H_f[\omega]\overline{H_g[\omega]}}{\sqrt{1-\left(\frac{\omega}{\pi}\right)^2}}d\omega,$$

where $H_g[\omega]$ is the fourier transform of f, and $\overline{H_g[\omega]}$ is the conjugate of the Fourier transform $H_g[\omega]$ of g[t]. Since $$\langle\langle f,f\rangle\rangle = \frac{1}{2\pi}\int_{-\pi}^{\pi}\frac{H_f[\omega]\overline{H_f[\omega]}}{\sqrt{1-\left(\frac{\omega}{\pi}\right)^2}}d\omega$$

and since all $\pi$ band limited square integrable functions functions have continuous Fourier transform transform on $[-\pi, \pi]$, $H_f[\omega]\overline{H_f[\omega]}$ is bounded by some positive number Q, we get that $$\langle\langle f,g\rangle\rangle = \frac{1}{2\pi}\int_{-\pi}^{\pi}\frac{H_f[\omega]\overline{H_g[\omega]}}{\sqrt{1-\left(\frac{\omega}{\pi}\right)^2}}d\omega$$

is convergent and $$\langle\langle f,f\rangle\rangle = \frac{1}{2\pi}\int_{-\pi}^{\pi}\frac{H_f[\omega]\overline{H_f[\omega]}}{\sqrt{1-\left(\frac{\omega}{\pi}\right)^2}}d\omega$$
$$= \frac{1}{2\pi}\int_{-\pi}^{\pi}\frac{\|H_f[\omega]\|^2}{\sqrt{1-\left(\frac{\omega}{\pi}\right)^2}}d\omega \le$$
$$\frac{1}{2\pi}\int_{-\pi}^{\pi}\frac{Q}{\sqrt{1-\left(\frac{\omega}{\pi}\right)^2}}d\omega = \frac{\pi Q}{2}$$

is also positive for all $\pi$ band limited square integrable functions functions.

Thus, again the correctness of expansion follows from the general theory of orthogonal functions, including the uniqueness, and the fact that expansions of lower order is a truncation of the expansion of higher order.

As shown before, $$\int_{-\infty}^{\infty}J_n[t]K_m[t]dt = (-1)^n\int_{-\infty}^{\infty}J_n[0-t]K_m[t]$$
$$= (-1)^n(J_n[t]*K_m[t])[0]$$

-continued
$$= (-1)^n\frac{1}{2\pi}\int_{-\pi}^{\pi}i^n T_m\left[\frac{\omega}{\pi}\right]\frac{(-1)^2\frac{2}{\pi}T_n\left[\frac{\omega}{\pi}\right]}{\sqrt{1-\left(\frac{\omega}{\pi}\right)^2}}e^{i\omega 0}d\omega$$

$$= (-1)^n\frac{2}{\pi}\frac{1}{2\pi}\int_{-\pi}^{\pi}\frac{(-1)^n i^{n+n}T_m\left[\frac{\omega}{\pi}\right]T_n\left[\frac{\omega}{\pi}\right]}{\sqrt{1-\left(\frac{\omega}{\pi}\right)^2}}d\omega$$

This implies $$\int_{-\infty}^{\infty}J_n[t]K_m[t]dt = 0 \text{ if } m\ne n;$$

and $$\int_{-\infty}^{\infty}J_m[t]K_m[t]dt = \lambda_m;$$

here $\lambda_m=1$ if m=0 and $\lambda_m=(-1)^m/2$ otherwise.

The above exposition used the Chebyshev polynomials merely as an example. In general, for any system of orthogonal polynomials $P_m[\omega]$, orthogonal with respect to the scalar product $$\int_{-\pi}^{\pi}w[\omega]P_n[\omega]P_m[\omega]d\omega,$$

the fundamental basis functions $$B_n[t] = \int_{-\pi}^{\pi}w[\omega]P_n[\omega]e^{i\omega t}d\omega$$

have the corresponding set of basis functions providing a global approximation, defined by $$S_n[t] = \int_{-\pi}^{\pi}P_n[\omega]e^{i\omega t}d\omega.$$

The global approximation using functions $S_n[t]$ comes from the corresponding approximation of the spectrum $H_f[\omega]$ using the family orthogonal polynomials $\{P_m[\omega]:n\in N\}$, with the same coefficients providing both an approximation in the frequency domain (the spectrum of the signal) and in the time domain.

Thus, if the signal is given by its values at a certain set of Nyqist rate sampling points S (not necessarily consecutive) AND also N of its chromatic derivatives are known at these Nyquist rate sampling points, the coefficients $\gamma[j]$ must provide not only the best least square fit for f[t] but they must also satisfy the requirement that $$CD[k, f_C[t]] [p] = \sum_{j=0}^{C}\frac{\gamma[j]}{2}(K_{k+j}[p] + (-1)^{Min[k,j]}K_{|k-j|}[p])$$

is the best least square fit of the values CD[k, p] for all k up to N and all of the sampling points p in the set S. Since the value of the signal and N chromatic derivatives at a point p determines the signal in an interval around the point p, if N is sufficiently large such a least square fit extracts information from a very precise description of the ENTIRE waveform containing the set S of sampling points. Thus, the values of chromatic derivatives produce a conditions for γ[j]'s which reduces the number of Nyquist rate points needed for a faithful representation of the Fourier transform of f[t].

Assume that the Nyquist rate values f[i] of f[t] and its chromatic derivatives CD[m,f][i] for m≤N are given for integers i such that |i|≤M.

The γ[j]'s can be obtained, by determining values for γ[j], 0≤j≤C which minimize the following expression:

$$\sum_{i=-M}^{M}\left(\left(f[i]-\sum_{j=0}^{C}\gamma[j]K_j[i]\right)^2+\right.$$

$$\left.\sum_{m=1}^{N}\left(CD[m,f,i]-\sum_{j=0}^{C}\frac{\gamma[j]}{2}(K_{m+n}[i]+(-1)^{Min[m,n]}K_{|m-n|}[i])\right)^2\right)$$

The minimization is again performed by differentiating with respect to γ[j] and setting the resulting linear equations to 0. The system is then solved for all γ[j].

Approximation of the spectrum $H_f[\omega]$ of a signal f[t] of the form $$H_f[\omega]\approx\sum_{k=0}^{C}2\pi\gamma[k]i^k T_k\left[\frac{\omega}{\pi}\right]$$

has one important property. It does NOT require any windowing of the signal. Rather, it produces an approximation which provides the best fit to the entire wave-form (rather than just Nyquist-rate sampling points) allowing arbitrary behaviour outside the time interval containing the samples. Thus, there are no artifacts of the windowing, with very accurate match of the waveform between the sampling points. Such approximation of the spectrum can be more informative than the standard one.

The above methods systems represent the core procedures which are called "The engine" of the Chromatic Signal Processing. As understood herein, these fundamental procedures do not depend in any essential way on any particular choice of a family of regular polynomials. Any method based on, for example Chebyshev polynomials, are adapted to any other family of regular polynomials by changing the base function $B_0[t]$ defined as decribed in this disclosure and by replacing the recursive relations particular to Chebyshev polynomials by the corresponding relations which the new family satisfies. What is essential and universal is the duality of operations on polynomials and on differential operators which allows the representation of band-limited function using differential operators as described in this disclosure

What is claimed is:

1. Within a sampling window, a method for digitizing a section of a band-limited (BL) analog signal, said method comprising the steps of:
   a) representing said section as a truncated series at a sampling moment disposed approximately in said sampling window, said truncated series having n+1 variable LSBPs as its coefficients to be solved numerically;
   b) obtaining discrete signal samples by sampling said section within an interval disposed within said sampling window; and
   c) solving numerically for said n+1 variable LSBPs to obtain n+1 numerical LSBPs by curve fitting said truncated series with said discrete signal samples.

2. The method of claim 1, wherein the width of said sampling window is determined from said n.

3. The method of claim 1, wherein in said step c) said truncated series is formed by n+1 fundamental basis functions of order 0 to n, with said n+1 numerical LSBPs as coefficients respectively for said n+1 fundamental basis functions.

4. The method of claim 3, wherein said fundamental basis functions are Bessel functions of order 0 to order n.

5. The method of claim 3, wherein the fundamental basis functions are Sinc functions.

6. The method of claim 1, wherein said n+1 numerical LSBPs are values of n+1 chromatic differential operators of order 0 to order n evaluated at said sampling moment.

7. The method of claim 6, wherein said n+1 chromatic differential operators of order 0 to order n are associated respectively with regular polynomials of order 0 to order n, wherein said n+1 regular polynomials feasibly separate points.

8. The method of claim 6, wherein said n+1 chromatic differential operators of order 0 to order n are associated respectively with Chebyshev polynomials of order 0 to order n.

9. The method of claim 6, wherein said n+1 chromatic differential operators of order 0 to order n are associated respectively with Legendre polynomials of order 0 to order n.

10. The method of claim 1, wherein in said step b) said discrete signal samples are obtained by oversampling said section, and wherein said approximation in said step c) is least-square fitting.

11. The method of claim 1, wherein said least-square fitting further comprises the steps of:
   forming squares of differences between said discrete signal samples and interpolated values of said truncated series;
   forming an sum of said squares;
   obtaining a system of n+1 linear equations with said n+1 variable LSBPs as variables by minimizing said sum respectively with said n+1 variable LSBPs; and
   solving for said n+1 variable LSBPs to obtain said n+1 numerical LSBPs that satisfy said system of n+1 linear equations.

12. The method of claim 1, further adapted for evaluating a chromatic derivative of order k for said truncated series order n<k by performing the steps comprised of:
   representing a first chromatic derivatives of order j for said truncated series as a first new truncated series at a first new sampling point, said first new truncated series representing a first new signal section;
   representing a second chromatic derivatives of order j for said truncated series as a second new truncated series at a second new sampling point, said second new truncated series representing a second new signal section overlapping with said first new signal section;
   generating a third new truncated series at a new third sampling point, said third new truncated series representing an envelop of said first and second new signal sections; and
   using chromatic derivatives of both said truncated series and said third new truncated series to find said chromatic derivative of order k.

13. Within a sampling window, a method for digitizing a section of a band-limited (BL) analog signal in the presence of noise, said method comprising the steps of:
   a) representing said section as a truncated series at a sampling moment disposed in said sampling window, said truncated series having n+1 variable LSBPs as its coefficients to be solved numerically;
   b) obtaining discrete samples of the sum of said signal section and said noise; and c) solving numerically for said n+1 variable LSBPs to obtain n+1 numerical LSBPs by an approximation technique.

14. The method of claim 13, wherein said approximation technique in said step c) is least-square fitting.

15. An analog/digital (A/D) converter having a data acquisition unit adapted for performing the steps of:
   a) representing a section of a BL signal within a sampling window as a truncated series at a sampling moment disposed approximately in said sampling window, said truncated series having n+1 variable LSBPs as its coefficients to be determined numerically;
   b) obtaining discrete signal samples by sampling said section within an interval disposed within said sampling window; and
   c) solving numerically for said n+1 variable LSBPs to obtain n+1 numerical LSBPs by curve fitting said truncated series with said discrete signal samples.

16. The A/D converter of claim 15, wherein said data acquisition unit further adapted for evaluating a chromatic derivative of order k for said truncated series order n<k by performing the steps comprised of:
   representing a first chromatic derivatives of order j for said truncated series as a first new truncated series at a first new sampling point, said first new truncated series representing a first new signal section;
   representing a second chromatic derivatives of order j for said truncated series as a second new truncated series at a second new sampling point, said second new truncated series representing a second new signal section overlapping with said first new signal section;
   generating a third new truncated series at a new third sampling point, said third new truncated series representing an envelop of said first and second new signal sections; and
   using chromatic derivatives of both said truncated series and said third new truncated series to find said chromatic derivative of order k.

17. The A/D converter of claim 15, wherein in said step c) said truncated series is formed by n+1 fundamental basis functions of order 0 to n, with said n+1 numerical LSBPs as coefficients respectively for said n+1 fundamental basis functions.

18. The A/D converter of claim 17, wherein said fundamental basis functions are Bessel functions of order 0 to order n.

19. The A/D converter of claim 17, wherein said fundamental basis functions are Sinc functions.

20. The A/D converter of claim 15, wherein said n+1 numerical LSBPs are values of n+1 chromatic differential operators of order 0 to order n evaluated at said sampling moment.

21. The A/D converter of claim 20, wherein said n+1 chromatic differential operators of order 0 to order n are associated respectively with regular polynomials of order 0 to order n, wherein said n+1 regular polynomial feasibly separate points.

22. The A/D converter of claim 20, wherein said n+1 chromatic differential operators of order 0 to order n are associated respectively with Chebyshev polynomials of order 0 to order n.

23. The A/D converter of claim 20, wherein said n+1 chromatic differential operators of order 0 to order n are associated respectively with Legendre polynomials of order 0 to order n.

24. The A/D converter of claim 15, wherein said discrete signal samples in said step b) is obtained by oversampling, and wherein said curve fitting in said step c) performed by said data acquisition unit is least square fitting.

25. The A/D converter of claim 24, wherein least square fitting performed by said data acquisition unit further comprises the steps of:
   forming squares of differences between said discrete signal samples and interpolated values of said truncated series;
   forming a sum of said squares;
   obtaining a system of n+1 linear equations with said n+1 variable LSBPs as variables by minimizing said sum respectively with said n+1 variable LSBPs;
   solving for said n+1 variable LSBPs to obtain said n+1 numerical LSBPs that satisfy said system of n+1 linear equations.

26. A method for characterizing a section of a BL analog signal, said method comprising the steps of:
   a) representing said section as a truncated series at a sampling moment disposed approximately in said sampling window, said truncated series parametrized by n+1 coefficients that are LSBPs adapted to encode local signal behavior of said section between Nyquist rate points;
   b) obtaining discrete signal samples by sampling said section within an interval disposed within said sampling window; and
   c) solving numerically for said LSBPs such that said numerical LSBPs are generated by approximation technique.

27. The method of claim 26, wherein the width of said window is determined from said n.

28. The method of claim 26, wherein said truncated series is formed by n+1 fundamental basis functions of order 0 to n, with said n+1 LSBPs as coefficients respectively for said n+1 fundamental basis functions.

29. The method of claim 28, wherein said fundamental basis functions are Bessel functions of order 0 to order n.

30. The method of claim 28, wherein said fundamental basis functions are Sinc functions.

31. The method of claim 26, wherein said n+1 LSBPs as solved in said step c) are values of n+1 chromatic differential operators of order 0 to order n evaluated at said sampling moment.

32. The method of claim 31, wherein said n+1 chromatic differential operator of order 0 to order n are associated respectively with regular polynomial of order 0 to order n, wherein said regular polynomials feasibly separate points.

33. The method of claim 31, wherein said n+1 chromatic differential operators of order 0 to order n are associated respectively with Chebyshev polynomials of order 0 to order n.

34. The method of claim 31, wherein said n+1 chromatic differential operators of order 0 to order n are associated respectively with Legendre polynomials of order 0 to order n.

35. The method of claim 26, wherein said discrete signal samples are obtained by over-sampling, and wherein said approximation technique in said step c) is least-square fitting.

36. The method of claim 35, wherein said least-square fitting further comprises the steps of:
   forming squares of differences between said discrete signal samples and interpolated values of said truncated series;
   forming a sum of said squares;
   obtaining a system of n+1 linear equations with said n+1 LSBPs as variables by minimizing said sum respectively with said n+1 LSBPs;

solving for said n+1 LSBPs by finding n+1 numerical values of said n+1 LSBPs that satisfy said system of n+1 linear equations.

37. A waveform coding unit having a data acquisition unit for performing the steps comprising of:
   a) representing said section of a BL signal within a sampling window as a truncated series at a sampling moment disposed approximately in said sampling window, said truncated series parametrized by n+1 coefficients that are LSBPs adapted to encode local signal behavior of said section between Nyquist rate points;
   b) obtaining discrete signal samples of said section within an interval disposed within said sampling window; and
   c) solving numerically for said LSBPs such that said numerical LSBPs are obtained from curve fitting of said truncated series with said discrete signal samples.

38. The waveform coding unit of claim 37, wherein the width of said sampling window is determined from said n.

39. The waveform coding unit of claim 37, wherein said truncated series is formed by n+1 fundamental basis functions of order 0 to n, with said n+1 LSBPs as coefficients respectively for said n+1 fundamental basis functions.

40. The waveform coding unit of claim 39, wherein said fundamental basis functions are Bessel functions of order 0 to order n.

41. The waveform coding unit of claim 39, wherein said fundamental basis functions are Sinc functions.

42. The waveform coding unit of claim 37, wherein said n+1 LSBPs as solved in said step c) are values of n+1 chromatic differential operators of order 0 to order n evaluated at said sampling moment.

43. The waveform coding unit of claim 42, wherein said n+1 chromatic differential operator of order 0 to order n are associated respectively with regular polynomial of order 0 to order n, wherein said regular polynomials feasibly separate points.

44. The waveform coding unit of claim 42, wherein said n+1 chromatic differential operators of order 0 to order n are associated respectively with Chebyshev polynomials of order 0 to order n.

45. The waveform coding unit of claim 42, wherein said n+1 chromatic differential operators of order 0 to order n are associated respectively with Legendre polynomials of order 0 to order n.

46. The waveform coding unit of claim 37, wherein said curve fitting is least square fitting.

47. The waveform coding unit of claim 46, wherein said square fitting further comprises the steps of:
   forming squares of differences between said discrete signal samples and interpolated values of said truncated series;
   forming an sum of said squares;
   obtaining a system of n+1 linear equations with said n+1 LSBPs as variables by minimizing said sum respectively with said n+1 LSBPs; and
   solving for said n+1 LSBPs by finding n+1 numerical values of said n+1 LSBPs that satisfy said system of n+1 linear equations.

48. Within a sampling window constituted by a first and a second local windows sharing an overlap, a method for digitizing a section of a BL signal having a first subsection in said first local window and a second subsection in said second local window, said method comprising the steps of:
   a1) representing said first subsection as a first truncated series at a first sampling moment disposed approximately in said first local window, said first truncated series parametrized by n+1 coefficients that are n+1 LSBPs adapted for characterizing local signal behavior of said first subsection between Nyquist points;
   a2) obtaining a first plurality of discrete signal samples from said first subsection;
   b1) representing said second subsection as a second truncated series at a second sampling moment disposed approximately in said second local window, said second truncated series parametrized by m+1 coefficients that are m+1 LSBPs adapted for characterizing local signal behavior of said second subsection between Nyquist points;
   b2) obtaining a second plurality discrete signal samples from said second subsection; and
   c) solving for numerical values of said n+1 and m+1 LSBPs together such that said numerical values of said n+1+m+1 LSBPs are generated by an approximation technique.

49. The method of claim 48, the width of said first local window is determined from said number n+1, and wherein the width of said second local window is determined from said number m+1.

50. The method of claim 48, wherein said first truncated series is formed by n+1 fundamental basis functions of order 0 to n, with said n+1 LSBPs as coefficients respectively for said n+1 fundamental basis functions, and wherein said second truncated series is formed by m+1 fundamental basis functions of order 0 to n, with said m+1 LSBPs as coefficients respectively for said m+1 fundamental basis functions.

51. The method of claim 50, wherein said n+1 fundamental basis functions are Bessel functions of order 0 to order n, and wherein said m+1 fundamental basis functions are Bessel functions of order 0 to order m.

52. The method of claim 50, wherein said fundamental basis functions are Sinc functions.

53. The method of claim 48, wherein said n+1 LSBPs are values of n+1 chromatic differential operators of order 0 to order n evaluated at said first sampling moment, and wherein said n+1 LSBPs are values of m+1 chromatic differential operators of order 0 to order m evaluated at said second sampling moment.

54. The method of claim 53, wherein said n+1 chromatic differential operators of order 0 to order n are associated respectively with regular polynomials of order 0 to order n, and wherein and said m+1 chromatic differential operators of order 0 to order m are associated respectively with regular polynomials of order 0 to order m, and wherein said regular polynomials feasibly separate points.

55. The method of claim 53, wherein said n+1 chromatic differential operators of order 0 to order n are associated respectively with Chebyshev polynomials of order 0 to order n, and wherein and said m+1 chromatic differential operators of order 0 to order m are associated respectively with Chebyshev polynomials of order 0 to order m.

56. The method of claim 53, wherein said n+1 chromatic differential operators of order 0 to order n are associated respectively with Legendre polynomials of order 0 to order n, and wherein said m+1 chromatic differential operators of order 0 to order m are associated respectively with Legendre polynomials of order 0 to order m.

57. The method of claim 48, wherein in said step a2) said first plurality of discrete samples is obtained by oversampling said first subsection within a first interval disposed within said first local window, wherein in said step b2) said second plurality of discrete samples is obtained by oversampling said second subsection within a second interval disposed within said second local window, and wherein in said step c) said approximation technique is least square fitting.

58. The method of claim 57, wherein said step c) further comprises the steps of:
representing p derivatives of order 1 to order p of said first subsection as p truncated series respectively parametrized by said n+1 LSBPs; and
representing q derivatives of order 1 to q of said second subsection as q truncated series respectively parametrized by m+1 LSBPs, wherein said p equals to said q.

59. The method of claim 58, wherein said step c) further comprise the steps of:
forming a first plurality of squares of a first plurality of differences within said first interval, wherein said first plurality of differences are between said first plurality of discrete signal samples and a first plurality of interpolated values of said first truncated series;
forming a second plurality of squares of a second plurality of differences within said second interval, wherein said second plurality of differences are between said second plurality of discrete signal samples and a second plurality of interpolated values of said first truncated series;
forming a third plurality of squares of a third plurality of differences, wherein said third plurality of differences are p differences that are respectively between interpolated values of said p truncated series and interpolated values of said q truncated series.

60. The method of claim 59, wherein said step c) further comprises the steps of:
forming a first sum by summing said first plurality of squares;
forming a second sum by summing said second plurality of squares;
forming a third sum by summing said third plurality of squares;
forming a final sum of said first, second and third sums;
obtaining a system of n+1+m+1 linear equations with said n+1+m+1 LSBPs as variables by minimizing said final sum respectively with said n+1+m+1 LSBPs; and
solving for said n+1+m+1 LSBPs that satisfy said system of n+l+m+1 linear equations.

61. The method of claim 48, further having an enveloping procedure comprising the steps of:
representing said section as a truncated series at a sampling moment disposed approximately in said sampling window, said truncated series parametrized by r+1 coefficients that are LSBPs adapted for encoding local signal behavior of said section between Nyquist rate points;
representing s chromatic derivatives of order 1 to order s of said section as s truncated series parametrized by said r+1 LSBPs;
solving for values of said r+1 LSBPs by performing an approximation procedure.

62. The method of claim 61, wherein said approximation procedure is least square fitting for 1) said truncated series with said first truncated series, 2) said truncated series with said second truncated series, and 3) said s truncated series respectively with chromatic derivatives of order 1 to order s for said first truncated series, and 4) said s truncated series respectively with chromatic derivatives of order 1 to order 2 for said second truncated series.

63. The method of claim 61 further adapted for evaluating a chromatic derivative of order k for said truncated series order r<k, comprising the steps of:
representing a first chromatic derivatives of order j for said truncated series as a first new truncated series at a first new sampling point, said first new truncated series representing a first new signal section;
representing a second chromatic derivatives of order j for said truncated series as a second new truncated series at a second new sampling point, said second new truncated series representing a second new signal section overlapping with said first new signal section;
generating a third new truncated series at a new third sampling point, said third new truncated series representing an envelop of said first and second new signal sections; and
using chromatic derivatives of both said truncated series and said third new truncated series to find said chromatic derivative of order k.

64. The method of claim 63, wherein j<k.

65. The method of claim 61, wherein an output signal section produced from a signal processing transformation on said section is obtained by the steps comprising:
representing said signal processing transformation as a r+1 by u+1 matrix;
representing said section as a vector of said r+1 LSBPs;
multiplying said vector by said matrix to obtain an output vector of u+1 entries, wherein said u+1 entries of said output vector are u+1 output LSBPs of said output signal section represented as a truncated series parametrized by said u+1 output LSBPs, and wherein said u+1 output LSBPs characterize behavior of said output signal section between Nyquist rate points.

66. For a sampling window constituted by a first and a second local windows sharing an overlap, an A/D converter for processing a section of a BL signal having a first subsection in a first local window and a second subsection in a second local window, comprising:
a data acquisition unit for performing the steps comprising of:
a1) representing said first subsection as a first truncated series at a first sampling moment disposed approximately in said first local window, said first truncated series parametrized by n+1 coefficients that are n+1 LSBPs adapted for characterizing local signal behavior of said first subsection between Nyquist points;
a2) obtaining a first plurality of discrete signal samples from said first local window;
b1) representing said second subsection as a second truncated series at a second sampling moment disposed approximately in said second local window, said second truncated series parametrized by m+1 coefficients that are m+1 LSBPs adapted for characterizing local signal behavior of said second subsection between Nyquist points;
b2) obtaining a second plurality discrete signal samples from said second local window; and
c) solving for numerical values of said n+1 and m+1 LSBPs together such that said numerical values of said n+1+m+1 LSBPs are generated by approximation techniques.

67. The A/D converter of claim 66, wherein the width of said first local window is determined from said n, and wherein the width of said second local window is determined from said m.

68. The A/D converter of claim 66, wherein said first truncated series is formed by n+1 fundamental basis functions of order 0 to n, with said n+1 LSBPs as coefficients respectively for said n+1 fundamental basis functions, and wherein said second truncated series is formed by m+1 fundamental basis functions of order 0 to m, with said m+1 LSBPs as coefficients respectively for said m+1 fundamental basis functions.

69. The A/D converter of claim 68, wherein said n+1 fundamental basis functions are Bessel functions of order 0 to order n, and wherein said m+1 fundamental basis functions are Bessel functions of order 0 to order m.

70. The A/D converter of claim 68, wherein said fundamental basis functions are Sinc functions.

71. The A/D converter of claim 66, wherein said n+1 LSBPs are values of n+1 chromatic differential operators of order 0 to order n evaluated at said first sampling moment, and wherein said n+1 LSBPs are values of m+1 chromatic differential operators of order 0 to order m evaluated at said second sampling moment.

72. The A/D converter of claim 71, wherein said n+1 chromatic differential operators of order 0 to order n are associated respectively with regular polynomials of order 0 to order n, and wherein and said m+1 chromatic differential operators of order 0 to order m are associated respectively with regular polynomials of order 0 to order m, wherein said regular polynomials feasibly separate points.

73. The A/D converter of claim 71, wherein said n+1 chromatic differential operators of order 0 to order n are associated respectively with Chebyshev polynomials of order 0 to order n, and wherein and said m+1 chromatic differential operators of order 0 to order m are associated respectively with Chebyshev polynomials of order 0 to order m.

74. The A/D converter of claim 71, wherein said n+1 chromatic differential operators of order 0 to order n are associated respectively with Legendre polynomials of order 0 to order n, and wherein said m+1 chromatic differential operators of order 0 to order m are associated respectively with Legendre polynomials of order 0 to order m.

75. The A/D converter of claim 66, wherein in said step a2) said first plurality of discrete samples is obtained by over-sampling said first subsection within a first interval disposed within said first local window, wherein in step b2) said second plurality of discrete samples is obtained by over-sampling said second subsection within a second interval disposed within said second local window, and wherein in said step c) said approximating is least square fitting.

76. The A/D converter of claim 75, wherein said step c) further comprises the steps of:
representing p derivatives of order 1 to order p of said first subsection as p truncated series respectively parametrized by said n+1 LSBPs; and
representing q derivatives of order 1 to q of said second subsection as q truncated series respectively parametrized by m+1 LSBPs, wherein said p equals to said q.

77. The A/D converter of claim 76, wherein said step c) further comprises the steps of:
forming a first plurality of squares of a first plurality of differences within said first interval, wherein said first plurality of differences are between said first plurality of discrete signal samples and a first plurality of interpolated values of said first truncated series;
forming a second plurality of squares of a second plurality of differences within said second interval, wherein said second plurality of differences are between said second plurality of discrete signal samples and a second plurality of interpolated values of said first truncated series;
forming a third plurality of squares of a third plurality of differences, wherein said third plurality of differences are p differences that are respectively between interpolated values of said p truncated series and interpolated values of said q truncated series.

78. The A/D converter of claim 77, wherein said step c) further comprises the steps of:
forming a first sun by summing said first plurality of squares;
forming a second sum by summing said second plurality of squares;
forming a third sum by summing said third plurality of squares;
forming a final sum of said first, second and third sums;
obtaining a system of n+1+m+1 linear equations with said n+1+m+1 LSBPs as variables by minimizing said final sum respectively with said n+1+m+1 LSBPs; and
solving for said n+1+m+1 LSBPs that satisfy said system of n+1+m+1 linear equations.

79. The A/D converter of claim 66, further comprising the steps of:
representing said section as a truncated series at a sampling moment disposed approximately in said sampling window, said truncated series parametrized by r+1 coefficients that are LSBPs adapted for encoding local signal behavior of said section between Nyquist rate points;
representing s chromative derivatives of order 1 to order s of said section as s truncated series parametrized by said r+1 LSBPs; and
solving for values of said r+1 LSBPs using an approximation procedure.

80. The A/D converter of claim 79, wherein said approximation procedure is least-square fitting for 1) said truncated series with said first truncated series, 2) said truncated series with said second truncated series, and 3) said s truncated series respectively with chromatic derivatives of order 1 to order s for said first truncated series, and 4) said s truncated series respectively with chromatic derivatives of order 1 to order 2 for said second truncated series.

81. The A/D converter of claim 79, further adapted for evaluating a chromatic derivative of order k for said truncated series order r<k by performing the steps comprised of:
representing a first chromatic derivatives of order j for said truncated series as a first new truncated series at a first new sampling point, said first new truncated series representing a first new signal section;
representing a second chromatic derivatives of order j for said truncated series as a second new truncated series at a second new sampling point, said second new truncated series representing a second new signal section overlapping with said first new signal section;
generating a third new truncated series at a new third sampling point, said third new truncated series representing an envelop of said first and second new signal sections; and
using chromatic derivatives of both said truncated series and said third new truncated series to find said chromatic derivative of order k.

82. The A/D converter of claim 81, wherein j<k.

83. The A/D converter of claim 66 that is coupled to a processor adapted for performing a signal processing transformation on said section by the steps comprising:
representing said signal processing transformation as a r+1 by u+1 matrix;

representing said section as a vector of said r+1 LSBPs; and multiplying said vector by said matrix to obtain an output vector of u+1 entries, wherein said u+1 entries of said output vector are u+1 output LSBPs of said output signal section represented as a truncated series parametrized by said u+1 output LSBPs, and wherein said output LSBPs characterize behavior of said output signal section between Nyquist rate points.

84. Within a sampling window, a method for digitizing a section of a BL analog signal, said method comprising the stops of:
   a) representing said section as a truncated series at a sampling moment disposed approximately in said sampling window, said truncated series parametrized by n+1 coefficients that are local signal behavior parameters (LSBPS) adapted for encoding local signal behavior of said section between Nyquist rate points;
   b) obtaining a continuous signal section of said section in a time interval within said sampling window; and
   c) solving for values of said LSBPs by approximation.

85. The method of claim 84, wherein the width of said sampling window is determined from said number n.

86. The method of claim 84, wherein said truncated series is formed by n+1 fundamental basis functions of order 0 to n, with said n+1 LSBPs as coefficients respectively for said n+1 fundamental basis functions.

87. The method of claim 86, wherein said fundamental basis functions are Bessel functions of order 0 to order n.

88. The method of claim 86, wherein said fundamental basis functions are Sinc functions.

89. The method of claim 84, wherein said n+1 LSBPs are values of n+1 chromatic differential operators of order 0 to order n evaluated at said sampling moment.

90. The method of claim 89, wherein said n+1 chromatic differential operators of order 0 to order n are associated respectively with regular polynomials of order 0 to order n, wherein said regular polynomials feasibly separate points.

91. The method of claim 89, wherein said n+1 chromatic differential operators of order 0 to order n are associated respectively with Chebyshev polynomials of order 0 to order n.

92. The method of claim 89, wherein said n+1 chromatic differential operators of order 0 to order n are associated respectively with Legendre polynomials of order 0 to order n.

93. The method of claim 84, wherein said approximation in said step c) is implemented by least-square fitting said truncated series with said continuous signal section within said time interval.

94. The method of claim 93, wherein said least-square fitting comprises the steps of:
   forming a square of the difference between said continuous signal section and said truncated series;
   forming an integral over said time interval for said square of the difference;
   obtaining a system of n+1 linear equations with said n+1 LSBPs as variables by minimizing said integral respectively with said n+1 LSBPs;
   solving for said n+1 LSBPs that satisfy said system of n+1 linear equations.

95. A signal processing system for processing data provided by a data acquisition unit adapted for performing the steps comprising of:
   a) representing said section as a truncated series at a sampling moment disposed approximately in said sampling window, said truncated series parametrized by n+1 coefficients that are local signal behavior parameters (LSBPs) adapted for encoding local signal behavior of said section between Nyquist rate points;
   b) obtaining a continuous signal section of said section in a time interval within said sampling window; and
   c) solving for values of said LSBPs by approximation.

96. The signal processing system of claim 95, wherein the width of said sampling window is determined from said n.

97. The signal processing system of claim 95, wherein said truncated series is formed by n+1 fundamental basis functions of order 0 to n, with said n+1 LSBPs as coefficients respectively for said n+1 fundamental basis functions.

98. The signal processing system of claim 97, wherein said fundamental basis functions are Bessel functions of order 0 to order n.

99. The signal processing system of claim 97, wherein said fundamental basis functions are Sinc functions.

100. The signal processing system of claim 95, wherein said n+1 LSBPs are values of n+1 chromatic differential operators of order 0 to order n evaluated at said sampling moment.

101. The signal processing system of claim 100, wherein said n+1 chromatic differential operators of order 0 to order n are associated respectively with regular polynomials of order 0 to order n, wherein said regular polynomials feasibly separate points.

102. The signal processing system of claim 100, wherein said n+1 chromatic differential operators of order 0 to order n are associated respectively with Chebyshev polynomials of order 0 to order n.

103. The signal processing system of claim 100, wherein said n+1 chromatic differential operators of order 0 to order n are associated respectively with Legendre polynomials of order 0 to order n.

104. The signal processing system of claim 95, wherein said approximation in said step c) is implemented by least-square fitting said truncated series with said continuous signal section within said time interval.

105. The signal processing system of claim 104, wherein said square fitting comprises the steps of:
   forming a square of the difference between said continuous signal section and said truncated series;
   forming an integral over said time interval for said square of the difference;
   obtaining a system of n+1 linear equations with said n+1 LSBPs as variables by minimizing said integral respectively with said n+1 LSBPs;
   solving for said n+1 LSBPs that satisfy said system of n+1 linear equations.

106. Within a sampling window constituted by a first local window and a second local window sharing an overlap, a method for digitizing a section of a BL analog signal having a first subsection in said first local window and a second subsection in said second local window, said method comprising the steps of:
   a1) representing said first subsection as a first truncated series at a first sampling moment disposed approximately in said first local window, said first truncated series parametrized by n+1 coefficients that are n+1 local signal behavior parameters (LSBPs) adapted for encoding local signal behavior of said first subsection between Nyquist rate points;
   b1) representing said second subsection as a second truncated series at a second sampling moment disposed approximately in said second local window, said second truncated series parametrized by m+1 coefficients that are m+1 LSBPs adapted for encoding local signal behavior of said second subsection between Nyquist rate points;

a2) obtaining a first continuous signal section of said first subsection in a first time interval within said first local window;

b2) obtaining a second continuous signal section of said second subsection in a second time interval within said second local window; and c) solving for values of said n+1 LSBPs and said m+1 LSBPs together by approximation.

107. The method of claim 106, wherein the width of said first local window is determined from said n, and wherein the width of said second local window is determined from said m.

108. The method of claim 106, wherein said first truncated series is formed by n+1 fundamental basis functions of order 0 to n, with said n+1 LSBPs as coefficients respectively for said n+1 fundamental basis functions, and wherein said second truncated series is formed by m+1 fundamental basis functions of order 0 to m, with said m+1 LSBPs as coefficients respectively for said m+1 fundamental basis functions.

109. The method of claim 108, wherein said n+1 fundamental basis functions are Bessel functions of order 0 to order n, and wherein said m+1 fundamental basis functions are Bessel functions of order 0 to order m.

110. The method of claim 108, wherein said n+1 fundamental basis functions are Sinc functions, and wherein said m+1 fundamental basis functions are Sinc functions.

111. The method of claim 106, wherein said n+1 LSBPs are values of n+1 chromatic differential operators of order 0 to order n evaluated at said first sampling moment, and wherein said n+1 LSBPs are values of m+1 chromatic differential operators of order 0 to order m evaluated at said second sampling moment.

112. The method of claim 111, wherein said n+1 chromatic differential operators of order 0 to order n are associated respectively with regular polynomials of order 0 to order n, and wherein and said m+1 chromatic differential operators of order 0 to order m are associated respectively with regular polynomials of order 0 to order m.

113. The method of claim 111, wherein said n+1 chromatic differential operators of order 0 to order n are associated respectively with Chebyshev polynomials of order 0 to order n, and wherein and said m+1 chromatic differential operators of order 0 to order m are associated respectively with Chebyshev polynomials of order 0 to order m.

114. The method of claim 111, wherein said n+1 chromatic differential operators of order 0 to order n are associated respectively with Legendre polynomials of order 0 to order n, and wherein said m+1 chromatic differential operators of order 0 to order m are associated respectively with Legendre polynomials of order 0 to order m.

115. The method of claim 106, wherein said approximation in said step c) is implemented by least-square fitting said first truncated series with said first continuous signal section within said first time interval, and said second truncated series with said second continuous signal section within said second time interval.

116. The method of claim 115, wherein said least-square fitting further comprises the steps of:

representing p derivatives of order 1 to order p of said first subsection as p truncated series parametrized by LSBPs taken from said n+1 LSBPs; and representing q derivatives of order 1 to q of said second subsection as q truncated series parametrized by LSBPs taken from said m+1 LSBPs.

117. The method of claim 116, wherein said square-fitting further comprises the steps of:

forming a first square of a first difference, wherein said first difference is between said first continuous signal section and said first truncated series;

forming a second square of a second difference, wherein said second difference is between said second continuous signal section and said second truncated series;

forming a third square of a third difference, wherein said third difference is a sum of p differences that are respectively between said p truncated series and said q truncated series.

118. The method of claim 117, wherein said square-fitting further comprises the steps of:

forming a first integral for said first square by integrating said first square over said first time interval; forming a second integral for said second square by integrating said second square over said second time interval;

forming a third integral for said third square by integrating said third square over a time interval lying within said overlap region;

forming a sum of said first, second and third integrals;

obtaining a system of n+1+m+1 linear equations with said n+1+m+1 LSBPs as variables by minimizing said sum respectively with said n+1+m+1 LSBPs; and solving for said n+1+m+1 LSBPs that satisfy said system of n+l+m+1 linear equations.

119. The method of claim 106, further comprising the steps of:

representing said section as a truncated series at a sampling moment disposed approximately in said sampling window, said truncated series parametrized by r+1 coefficients that are LSBPs adapted for encoding local signal behavior of said section between Nyquist rate points;

representing s chromatic derivatives of order 1 to order s of said section as s truncated series parametrized by said r+1 LSBPs; and solving for values of said r+1 LSBPs by an approximation technique.

120. The method of claim 119, wherein said approximation technique is least-square fitting for 1) said truncated series with said first truncated series, 2) said truncated series with said second truncated series, and 3) said s truncated series respectively with chromatic derivatives of order 1 to order s for said first truncated series, and 4) said s truncated series respectively with chromatic derivatives of order 1 to order s for said second truncated series.

121. The method of claim 119, further comprising the steps for evaluating a chromatic derivative of order k for said truncated series order r<k:

representing a first chromatic derivatives of order j for said truncated series as a first new truncated series at a first new sampling point, said first new truncated series representing a first new signal section;

representing a second chromatic derivatives of order j for said truncated series as a second new truncated series at a second new sampling point, said second new truncated series representing a second new signal section overlapping with said first new signal section;

generating a third new truncated series at a new third sampling point, said third new truncated series representing an envelop of said first and second new signal sections; and using chromatic derivatives of both said truncated series and said third new truncated series to find said chromatic derivative of order k.

122. The method of claim 121, wherein j<k.

123. The method of claim 119, wherein an output signal section produced from a signal processing transformation on said section is obtained by the steps comprising:

representing said signal processing transformation as a r+1 by u+1 matrix;

representing said section as a vector of said r+1 LSBPs;

multiplying said vector by said matrix to obtain an output, vector of u+1 entries, wherein said u+1 entries of said output vector are u+1 output LSBPs of said output signal section represented as a truncated series parametrized by said u+1 output LSBPs, and wherein said output LSBPs characterize behavior of said output signal section between Nyquist rate points.

124. A data acquisition unit for processing a section of a BL analog signal within a sampling window constituted by a local window and a second local window sharing an overlap, said data acquisition unit adapted for performing steps comprised of:

a1) representing a first subsection in said first local window as a first truncated series at a first sampling section disposed approximately in said first local window, said first truncated series parametrized by n+1 coefficients that are n+1 local signal behavior parameters (LSBPs) adapted for encoding local signal behavior of said first subsection between Nyquist rate points;

b1) representing a second subsection in said second local window as a second truncated series at a second sampling section disposed approximately in said second local window, said second truncated series parametrized by m+1 coefficients that are m+1 LSBPs adapted for encoding local signal behavior of said second subsection between Nyquist rate points;

a2) obtaining a first continuous signal section of said first subsection in a first time interval within said first local window;

b2) obtaining a second continuous signal section of said second subsection in a second time interval within said second local window; and c) solving for values of said n+1 LSBPs and said m+1 LSBPs together by approximation.

125. The data acquisition unit of claim 124, wherein the width of said first local window is determined from said n, and wherein the width of said second local window is determined from said m.

126. The data acquisition unit of claim 124, wherein said first truncated series is formed by n+1 fundamental basis functions of order 0 to n, with said n+1 LSBPs as coefficients respectively for said n+1 fundamental basis functions, and wherein said second truncated series is formed by m+1 fundamental basis functions of order 0 to m, with said m+1 LSBPs as coefficients respectively for said m+1 fundamental basis functions.

127. The data acquisition unit of claim 126, wherein said n+1 fundamental basis functions are Bessel functions of order 0 to order n, and wherein said m+1 fundamental basis functions are Bessel functions of order 0 to order m.

128. The data acquisition unit of claim 126. wherein said n+1 fundamental basis functions are Sinc functions, and wherein said m+1 fundamental basis functions are Sinc functions.

129. The data acquisition unit of claim 124, wherein said n+1 LSBPs are values of n+1 chromatic differential operators of order 0 to order n evaluated at said first sampling moment, and wherein said n+1 LSBPs are values of m+1 chromatic differential operators of order 0 to order m evaluated at said second sampling moment.

130. The data acquisition unit of claim 129, wherein said n+1 chromatic differential operators of order 0 to order n are associated respectively with regular polynomials of order 0 to order n, and wherein and said m+1 chromatic differential operators of order 0 to order m are associated respectively with regular polynomials of order 0 to order m.

131. The data acquisition unit of claim 129, wherein said n+1 chromatic differential operators of order 0 to order n are associated respectively with Chebyshev polynomials of order 0 to order n, and wherein and said m+1 chromatic differential operators of order 0 to order m are associated respectively with Chebyshev polynomials of order 0 to order m.

132. The data acquisition unit of claim 129, wherein said n+1 chromatic differential operators of order 0 to order n are associated respectively with Legendre polynomials of order 0 to order n, and wherein said m+1 chromatic differential operators of order 0 to order m are associated respectively with Legendre polynomials of order 0 to order m.

133. The data acquisition unit of claim 124, wherein said approximation in said step c) performed by said data acquisition unit is implemented by least-square fitting said first truncated series with said first continuous signal section within said first time interval, and said second truncated series with said second continuous signal section within said second time interval.

134. The data acquisition unit of claim 133, wherein said least-square fitting performed by said data acquisition unit further comprises the steps of:

representing p derivatives of order 1 to order p of said first subsection as p truncated series parametrized by LSBPs taken from said n+1 LSBPs, said p<n; and representing q derivatives of order 1 to q of said second subsection as q truncated series parametrized by LSBPs taken from said m+1 LSBPs, said b<m.

135. The data acquisition unit of claim 131, wherein said least-square fitting performed by said data acquisition units further comprises the steps of:

forming a first square of a first difference, wherein said first difference is between said first continuous signal section and said first truncated series;

forming a second square of a second difference, wherein said second difference is between said second continuous signal section and said second truncated series; and forming a third square of a third difference, wherein said third difference is a sum of p differences that are respectively between said p truncated series and said q truncated series.

136. The data acquisition unit of claim 131, wherein said least-square fitting performed by said data acquisition units further comprises the steps of:

forming a first integral for said first square by integrating said first square over said first time interval;

forming a second integral for said second square by integrating said second square over said second time interval;

forming a third integral for said third square by integrating said third square over a time interval lying within said overlap region;

forming a sum of said first, second and third integrals;

obtaining a system of n+1+m+1 linear equations with said n+1+m+1 LSBPs as variables by minimizing said sum respectively with said n+1+m+1 LSBPs; and solving for said n+1+m+1 LSBPs that satisfy said system of n+1+m+1 linear equations.

137. The data acquisition unit of claim 124, further adapted for performing the steps comprising of:

representing said section as a truncated series at a sampling moment disposed approximately in said sampling window, said truncated series parametrized by r+1 coefficients that are LSBPs adapted for encoding local signal behavior of said section between Nyquist rate points;

representing s chromatic derivatives of order 1 to order s of said section as s truncated series parametrized by said r+1 LSBPs; and solving for values of said r+1 LSBPs by an approximation technique.

138. The data acquisition unit of claim 137, wherein said approximation technique is least-square fitting for 1) said truncated series with said first truncated series, 2) said truncated series with said second truncated series, and 3) said s truncated series respectively with chromatic derivatives of order 1 to order s for said first truncated series, and 4) said s truncated series respectively with chromatic derivatives of order 1 to order 2 for said second truncated series.

139. The data acquisition unit of claim 137, further adapted for evaluating a chromatic derivative of order k for said truncated series order r<k by performing the steps comprised of:

representing a first chromatic derivatives of order j for said truncated series as a first new truncated series at a first new sampling point, said first new truncated series representing a first new signal section;

representing a second chromatic derivatives of order j for said truncated series as a second new truncated series at a second new sampling point, said second new truncated series representing a second new signal section overlapping with said first new signal section;

generating a third new truncated series at a new third sampling point, said third new truncated series representing an envelop of said first and second new signal sections; and using chromatic derivatives of both said truncated series and said third new truncated series to find said chromatic derivative of order k.

140. The data acquisition unit of claim 137, wherein an output signal section produced from a signal processing transformation on said section is obtained by the steps comprising:

representing said signal processing transformation as a r+1 by u+1 matrix;

representing said section as a vector of said r+1 LSBPs;

multiplying said vector by said matrix to obtain an output vector of u+1 entries, wherein said u+1 entries of said output vector are u+1 output LSBPs of said output signal section represented as a truncated series parametrized by said u+1 output LSBPs, and wherein said output LSBPs characterize behavior of said output signal section between Nyquist rate points.

141. Within a sampling window, a method for reconstructing an estimate of a section of a BL analog signal in the presence of noise, said method comprising the steps of:

a) representing said section as a truncated series at a sampling moment disposed approximately in said sampling window, said truncated series parametrized by n+1 coefficients of fundamental basis functions of order 0 to n, that are local signal behavior parameters (LSBPs) adapted for encoding local signal behavior of said section;

b) multiplying the continuous noisy signal with functions derived from said (n+1) fundamental basis functions and with a window function, then integrating these products over time to obtain n+1 integrals;

c) sampling the n+1 integrals at the center of the time window to obtain the numerical values of said n+1 coefficients to be used in the estimation of the signal.

142. The signal processing system of claim 141, wherein the width of said sampling window is determined from said n.

143. The signal processing system of claim 141, wherein said fundamental basis functions are Bessel functions of order 0 to order n.

144. The signal processing system of claim 141, wherein said fundamental basis functions are Sinc functions.

145. The signal processing system of claim 141, wherein said n+1 LSBPs are values of n+1 chromatic differential operators of order 0 to order n evaluated at said sampling moment.

146. The signal processing system of claim 145, wherein said n+1 chromatic differential operators of order 0 to order n are associated respectively with regular polynomials of order 0 to order n, wherein said regular polynomials feasibly separate points.

147. The signal processing system of claim 145, wherein said n+1 chromatic differential operators of order 0 to order n are associated respectively with Chebyshev polynomials of order 0 to order n.

148. The signal processing system of claim 145, wherein said n+1 chromatic differential operators of order 0 to order n are associated respectively with Legendre polynomials of order 0 to order n.

149. A signal processing system for a signal transformation using the steps comprising of:

representing a signal transformation as a r+1 by u+1 matrix;

representing an input as a vector of r+1 LSBPs;

multiplying said vector by said matrix to obtain an output vector of u+1 entries, wherein said u+1 entries of said output vector are s+1 output LSBPs of an output signal represented as a truncated series parametrized by said u+1 output LSBPs, and wherein said output LSBPs characterize behavior of said output signal between Nyquist rate points.

150. A signal processing system adapted for performing the steps comprised of:

obtaining an approximation to the Fourier transform of a signal f(t) characterized by n+1 LSBPs, wherein said n+1 LSBPs are n+1 coefficients of a truncated series at $t_0$ representing said signal f(t), and wherein said LSBPs are values of chromatic differential operators of order 0 to order n applied to said signal f(t) at $t_0$.

* * * * *